(12) United States Patent
Misewich et al.

(10) Patent No.: US 6,744,087 B2
(45) Date of Patent: Jun. 1, 2004

(54) NON-VOLATILE MEMORY USING FERROELECTRIC GATE FIELD-EFFECT TRANSISTORS

(75) Inventors: James A. Misewich, Peekskill, NY (US); William Robert Reohr, Ridgefield, CT (US); Alejandro Gabriel Schrott, New York, NY (US); Li-Kong Wang, Montvale, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/256,881

(22) Filed: Sep. 27, 2002

(65) Prior Publication Data

US 2004/0061153 A1 Apr. 1, 2004

(51) Int. Cl.[7] .................... H01L 29/76; H01L 29/772
(52) U.S. Cl. ..................................... 257/295; 257/328
(58) Field of Search ............................. 257/295, 328

(56) References Cited

U.S. PATENT DOCUMENTS

| | | | |
|---|---|---|---|
| 3,832,700 A | | 8/1974 | Wu et al. |
| 4,873,664 A | | 10/1989 | Eaton, Jr. |
| 4,888,733 A | | 12/1989 | Mobley |
| 5,418,389 A | | 5/1995 | Watanabe |
| 5,757,042 A | | 5/1998 | Evans, Jr. et al. |
| 5,789,775 A | | 8/1998 | Evans, Jr. et al. |
| 5,804,850 A | | 9/1998 | Evans, Jr. et al. |
| 5,940,705 A | * | 8/1999 | Lee et al. ............ 438/258 |
| 6,067,244 A | | 5/2000 | Ma et al. |
| 6,229,728 B1 | | 5/2001 | Ono et al. |
| 6,259,114 B1 | | 7/2001 | Misewich et al. |
| 6,285,577 B1 | * | 9/2001 | Nakamura ............ 365/145 |
| 6,333,543 B1 | | 12/2001 | Schrott et al. |
| 6,350,622 B2 | | 2/2002 | Misewich et al. |
| 6,495,878 B1 | * | 12/2002 | Hayashi et al. ......... 257/310 |
| 2002/0125517 A1 | * | 9/2002 | Nakamura ............ 257/295 |

OTHER PUBLICATIONS

Georg Braun et al., "A Robust 8F2 Ferroelectric RAM Cell With Depletion Device (DeFeRAM)," IEEE Journal of Solid–State Circuits, vol.: 35, Issue: 5, pp. 691–696, May 2000.

* cited by examiner

Primary Examiner—Allan R. Wilson
(74) Attorney, Agent, or Firm—Thu Ann Dang; Ryan, Mason, & Lewis, LLP

(57) ABSTRACT

A vertical ferroelectric gate field-effect transistor (FeGFET) device comprises a substrate and a first drain/source electrode formed on an upper surface of the substrate. An electrically conductive channel region is formed on an upper surface of the first drain/source electrode and electrically contacting the first drain/source electrode. The FeGFET device further comprises a ferroelectric gate region formed on at least one side wall of the channel region, at least one gate electrode electrically contacting the ferroelectric gate region, and a second drain/source electrode formed on an upper surface of the channel region and electrically contacting the channel region. The ferroelectric gate region is selectively polarizable in response to a potential applied between the gate electrode and at least one of the first and second drain/source electrodes. A non-volatile memory array can be formed comprising a plurality of FeGFET devices.

10 Claims, 26 Drawing Sheets

NON-VOLATILE MEMORY USING FERROELECTRIC GATE FIELD-EFFECT TRANSISTORS

CROSS-REFERENCE TO RELATED APPLICATIONS

The present application is related to the U.S. patent application identified by Ser. No. 10/256,715 and entitled "Memory Array Employing Single Three-terminal Non-volatile Storage Elements," which is filed concurrently herewith and incorporated herein by reference.

FIELD OF THE INVENTION

The present invention relates generally to non-volatile memory circuits, and more particularly relates to a non-volatile memory circuit comprising a plurality of memory cells including a ferroelectric gate field-effect transistor (FeGFET) and techniques for fabricating a FeGFET device.

BACKGROUND OF THE INVENTION

Using ferroelectric material in the manufacture of non-volatile memories has been well-established. For instance, U.S. Pat. No. 3,832,700 issued to Wu et al. describes a ferroelectric memory device which utilizes remnant polarization of a ferroelectric film as the storage mechanism. This structure may be considered analogous to a conventional electrically erasable programmable read-only memory (EEPROM). U.S. Pat. No. 4,873,664 issued to Eaton, Jr. describes a semiconductor memory device utilizing memory cells having a ferroelectric capacitor coupled to a bit line via a transistor, much like a conventional dynamic random access memory (DRAM).

Both DRAM-like memory cell structures and EEPROM-like cell structures have been proposed for use in ferroelectric memory products. Modern ferroelectric memory products exploit the DRAM-type cell structure exclusively. Such structures have both the advantage of minimizing integration complexity, by separating the storage capacitor from the silicon devices region, and improving cell density, by stacking the ferroelectric apacitor on top of the silicon devices.

Although this type of memory may be easy to fabricate, the DRAM-like cell structure has several disadvantages, including coupled noise sensitivity, coupled noise generation, large power consumption and low overall performance. The density of the memory device suffers compared to conventional DRAM due, at least in part, to the use of a ferroelectric capacitor plate electrode and the need for a special driver circuit. Moreover, because the driver circuit must be capable of driving a heavily loaded wire during read and write operations, it is particularly slow. Additionally, a boosted high voltage signal is required for both read and write operations. This results in significant noise coupling between signal lines as well as high power consumption. Although there has been some recent progress in terms of density, power consumption and material-related problems, several fundamental issues remain in ferroelectric memories exploiting a DRAM-type cell structure which prevent this type of conventional memory from being used in high density, high speed and/or low power applications.

As previously stated, EEPROM-like memory cell structures have been suggested for use in fabricating non-volatile memory devices since about 1974. However, fabricating ferroelectric gate dielectric on silicon introduces several material-related problems as well as electrical problems, including, for example, dipole instability, since silicon channels generally fail to provide enough carrier density to neutralize the depolarization fields that impair ferroelectric retention (see, e.g., P. Wurfel and I. B. Batra, Phys Rev B Vol. 8, 5126 (1973)). Additionally, the write operation to reverse the polarization orientation in a memory cell is difficult to accomplish using conventional ferroelectric memory structures.

There exists a need, therefore, for an improved ferroelectric structure that can be used to fabricate non-volatile memory devices which does not exhibit the above-noted disadvantages present in conventional ferroelectric memory devices.

SUMMARY OF THE INVENTION

The present invention provides techniques for forming a ferroelectric gate field-effect transistor device and a non-volatile memory architecture employing such devices.

In accordance with one aspect of the invention, a semiconductor device comprises a field-effect transistor (FET) formed on a silicon substrate, the FET including a drain region and a source region, and a ferroelectric gate field-effect transistor (FeGFET) for storing a logical state of the semiconductor device. The FeGFET comprises a gate electrode formed on an upper surface of the substrate and in electrical contact with one of the drain region and the source region of the FET, a ferroelectric gate dielectric layer formed on an upper surface of the gate electrode, an electrically conductive channel layer formed on an upper surface of the ferroelectric gate dielectric layer, and first and second drain/source electrodes, the first and second drain/source electrodes being formed on and electrically contacting the channel layer at laterally opposing ends of the channel layer. The ferroelectric gate dielectric layer is selectively polarizable in response to a potential applied between the gate electrode and at least one of the first and second drain/source electrodes.

In accordance with another aspect of the invention, a vertical FeGFET device comprises a substrate and a first drain/source electrode formed on an upper surface of the substrate. An electrically conductive channel region is formed on an upper surface of the first drain/source electrode and electrically contacting the first drain/source electrode. The FeGFET device further comprises a ferroelectric gate region formed on at least one side wall of the channel region, at least one gate electrode electrically contacting the ferroelectric gate region, and a second drain/source electrode formed on an upper surface of the channel region and electrically contacting the channel region. The ferroelectric gate region is selectively polarizable in response to a potential applied between the gate electrode and at least one of the first and second drain/source electrodes.

A non-volatile memory cell formed in accordance with one embodiment of the present invention comprises a first FET, at least a second FET, and a FeGFET for storing a logical state of the memory cell. The FeGFET is operatively coupled to the first and second FETs. Each of the first and second FETs include a control input for selectively accessing the FeGFET in response to a control signal presented thereto.

A non-volatile memory array formed in accordance with another embodiment of the invention comprises a plurality of memory cells, at least one of the memory cells including a FeGFET for storing a logical state of the memory cell, the FeGFET having a first drain/source terminal and a second drain/source terminal. The memory cell further includes a first switch operatively coupled to the first drain/source terminal of the FeGFET and at least a second switch operatively coupled to the second drain/source terminal of the FeGFET. A plurality of bit lines and word lines are operatively coupled to the memory cells for selectively reading and writing one or more memory cells in the memory array.

These and other objects, features and advantages of the present invention will become apparent from the following detailed description of illustrative embodiments thereof, which is to be read in connection with the accompanying drawings.

DETAILED DESCRIPTION OF THE PREFERRED EMBODIMENTS

The present invention relates to a ferroelectric device, in particular, a ferroelectric gate field-effect transistor (FeGFET), and techniques for fabricating same. Such FeGFET device, in accordance with one aspect of the invention, may be utilized in forming an improved non-volatile memory device. The FeGFET device will be described herein with reference to a complementary metal-oxide-semiconductor (CMOS) fabrication process. It should be appreciated, however, that the present invention is not limited to this or any particular fabrication process. Rather, the invention is more generally applicable to any fabrication process, such as, for example, a bipolar integrated circuit fabrication process. Although implementations of the FeGFET device are described herein in conjunction with a non-volatile memory architecture, the present invention is not limited to such architecture and/or application, and modifications to the inventive memory architecture may be made, as will be understood by those skilled in the art. Moreover, the memory array of the present invention is described herein as employing a plurality of FeGFET devices. It should be understood, however, that any three-terminal storage element exhibiting a variable resistance change caused by an applied electric field may be employed with the present invention, wherein the change in resistance is preserved after removal of the field.

Figure 1:
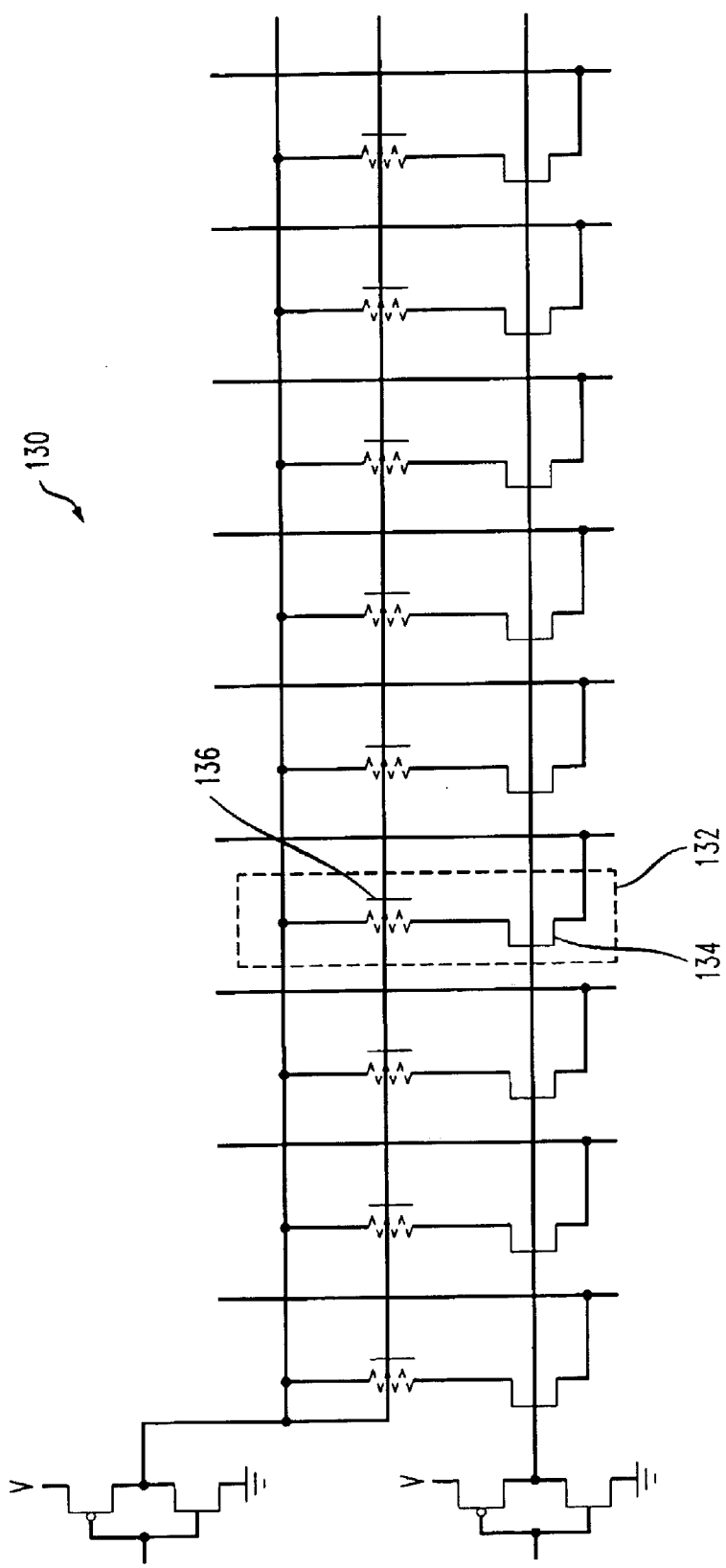
FIG. 1 is a schematic diagram illustrating a portion of a conventional ferroelectric memory device.

FIG. 1 illustrates a conventional memory architecture 130 employing a plurality of memory cells 132, each memory cell including a ferroelectric field-effect transistor (FET) 136 and an FET pass transistor 134. The ferroelectric FET is used for non-volatile data storage while the FET pass transistor controls reading from and writing to the ferroelectric FET in response to a word line signal presented thereto. The write operation directed to this conventional memory cell suffers, however, as a result of the direct connection between the gate and source node of the ferroelectric FET 136.

Figure 2A:
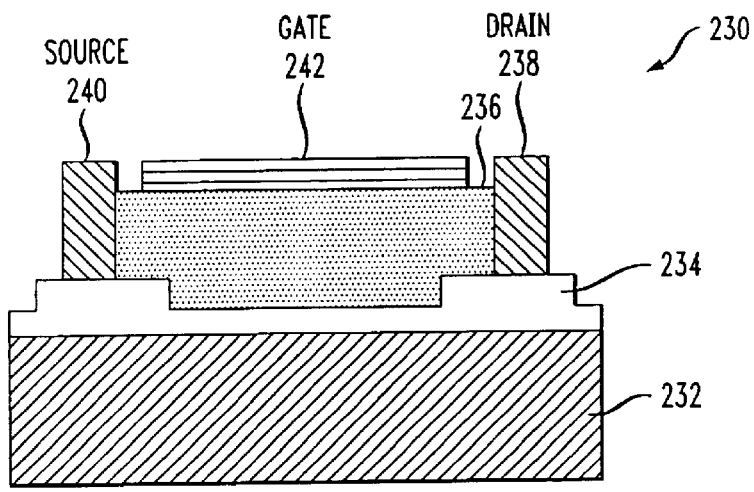
FIG. 2A is a cross-sectional view depicting an exemplary planar ferroelectric gate field effect transistor (FeGFET) device, formed in accordance with one aspect of the present invention.

FIG. 2A illustrates an exemplary FeGFET 230, formed in accordance with one aspect of the invention, which may be used, for example, in a non-volatile memory cell. The FeGFET comprises a ferroelectric gate 236 formed in close relative proximity to an oxide channel 234. As apparent from the figure, channel 234 is preferably deposited or grown on a substrate 232. The material used to form the substrate 232 may be, for example, strontium titanate oxide (STO), although alternative materials may be used, as will be known by those skilled in the art. The ferroelectric gate preferably modulates a conductivity of the oxide channel in response to a potential applied thereto. While most ferroelectric FETs may be used to form a memory cell offering an advantage of a nondestructive read operation, the FeGFET of the present invention offers simpler integration with conventional CMOS technology, since its channel is known to integrate well with the ferroelectric gate. It is to be appreciated that the FeGFET device 230 is not limited to the specific structure shown.

The channel 234 of the illustrative FeGFET device 230 is comprised of a material in which a measurable change in resistivity is produced in response to the application of an electric field in close relative proximity thereto. A suitable material which provides such characteristic preferably includes a predetermined percentage mixture of strontium ruthenate oxide (SRO) and STO ranging from $SrTi_{0.50}Ru_{0.50}O_3$ to $SrTi_{0.10}Ru_{0.90}O_3$. Other materials which may be utilized for forming the channel layer include, but are not limited to, $La_xSr_{1-x}Co_yTM_{1-x}$, where TM is a particular transition metal, $LaNi_xTM_{1-x}O_3$, Sn underdoped $In_2O_3$, etc. The SRO/STO channel layer 234 may be deposited using conventional means, such as, for example, pulsed laser deposition (PLD), sputtering, chemical vapor deposition (CVD), chemical solution deposition, etc. The SRO/STO channel layer need not be a single crystal film. The amount of change of electrical resistivity in the channel in response to the applied electric field is preferably selectively controlled by modifying one or more properties of the channel layer 234. Such properties include, for example, the thickness of the channel layer and the type of material used to form the channel layer.

A ferroelectric gate dielectric layer 236 is deposited or grown on the channel 234. The ferroelectric gate dielectric material may be formed of lead zirconate titanate ($PbZr_xTi_{1-x}O_3$, where x ranges from 0.10 to 0.55, or PZT), although alternative materials may similarly be employed, such as, but not limited to, $Bi_3Ti_4O_{12}$ and $Pb_{1-x}La_x(Ti_{1-x}Zr_y)O_3$ (i.e., PLZT), where x=0 to 0.2; y=0.1 to 0.55. The thickness of the ferroelectric gate dielectric layer can be varied so as to optimize the ferroelectric properties of the device. Since a polarization of the ferroelectric gate dielectric layer is preferably saturated in the presence of a relatively small applied electric field, a ferroelectric gate dielectric layer having the smallest thickness possibly may be employed, provided satisfactory coercive fields can be obtained. However, a ferroelectric gate dielectric layer that is too thin may cause excessive leakage current or the ferroelectric properties to be lost. In this regard, a ferroelectric gate dielectric layer thickness on the order of 100 nanometers (nm) to 300 nm is preferably employed.

A conductive layer 242 is formed on the ferroelectric gate dielectric layer 236 for providing an electrical connection to the ferroelectric gate dielectric layer. Conductive layer 242 may be fabricated using, for example, Pt or Ir, and forms a gate terminal of the FeGFET device. The FeGFET device also includes a drain terminal 238 and a source terminal 240. The drain and source terminals are preferably formed of an electrically conductive material, such as, for example, Pt or Ir or Au or Pd, and are used to provide an electrical connection to the channel layer 234, preferably at opposing ends of the channel, as shown. It is to be appreciated that the FeGFET, like conventional FET devices, is bi-directional in nature, and thus the definition of the drain and source terminals is arbitrarily chosen and may, in fact, be reversed.

The FeGFET device essentially functions as a conventional field effect device, with an added benefit of remanence. Remanence may be defined as the polarized state that remains after the applied gate voltage is removed or set to zero. As previously stated, the channel layer 234 in the FeGFET device is preferably comprised of a solid solution of SRO/STO. SRO is an oxide material often used as an electrode material for perovskite ferroelectric materials. SRO has a relatively high conductivity and exhibits metallic behavior, generally ranging from about $5 \times 10^3$ to $10^4$ (ohm-cm)$^{-1}$, thus exhibiting a more metallic characteristic.

To form the channel material, SRO may be combined in solid solution with STO in a manner which reduces the conductivity of the material, generally ranging from about $10^{-4}$ to $3 \times 10_3$ (ohm-cm)$^{-1}$, thus making the material exhibit a more semiconductive characteristic. However, the SRO/STO solution preferably has a high enough off-state free carrier concentration (e.g., on the order of $10^{22}$ carriers/cm$^3$) to provide sufficient charge balancing for ferroelectric dipole stability and a semiconducting behavior for suitable modulation of the channel conductivity by the applied gate field.

The non-volatile characteristic of the FeGFET device will now be described with continued reference to FIG. 2A. Consider the source terminal 240 to be at a negative voltage supply potential, which may be ground, and the drain terminal 238 to be at substantially the same potential as the source terminal (e.g., ground) or floating. When a negative potential is applied to the gate terminal 242 which is sufficient to create a field greater than the coercive field of the ferroelectric gate dielectric material, the ferroelectric gate dielectric layer 236 becomes polarized in a manner which draws holes (positive charge carriers) into the channel material. Since SRO is an n-type material, the presence of additional holes in the material decreases the conductivity of the channel 234. Due to remanent polarization of the ferroelectric material in the ferroelectric gate dielectric layer 236, the channel 234 remains in a low conductivity state, even after the gate potential is removed from the device, or when the gate/source-drain potential goes to zero. This low-conductivity state of the FeGFET device is defined herein as "STATE 1," and since the state is maintained when the gate field is removed, it is considered to be a non-volatile state.

Alternatively, a positive potential, sufficient to create a field greater than the coercive field of the ferroelectric gate dielectric material, may be applied to the gate terminal 242 when the source and drain are near ground potential. In this case, the ferroelectric gate dielectric layer 236 becomes polarized in a manner which draws electrons (negative charge carriers) into the channel 234. Again, since SRO is an n-type material, the presence of additional electrons in the material increases the conductivity of the channel. As previously stated, due to the remanent polarization of the ferroelectric material in the ferroelectric gate dielectric layer, the channel remains in a high conductivity state when the gate field is removed, or when the gate/source-drain potential goes to zero. This high-conductivity state of the FeGFET device is defined herein as "STATE 2."

The conductivity of the channel in either state (e.g., state 1 or state 2) may be determined by evaluating a drain/source conductivity of the FeGFET device. As long as this determination is made with a potential less than the coercive field of the ferroelectric gate dielectric material, the read will be nondestructive (i.e., the state of the channel will be maintained). The present invention is distinct from conventional devices, in at least one aspect, in that the channel material preferably exhibits an acquiescent resistivity lower than two milliohm-centimeters (mΩ-cm).

It is to be appreciated that, in accordance with another aspect of the invention, the channel layer 234 in the FeGFET device can alternatively be formed last, on top of the ferroelectric gate dielectric layer 236, thus creating a gate/PZT/channel FeGFET (not shown), rather than depositing the channel layer 234 first as in the channel/PZT/gate FeGFET previously described and shown in FIG. 2A. Depending on the fabrication process employed, this alternative processing methodology may advantageously simplify an integration of the FeGFET device with interconnect processing steps and/or other processing steps which may be required to form a non-volatile memory comprising a plurality of FeGFET memory cells and peripheral memory circuits. The operation of this inverted FeGFET (gate/PZT/channel) is essentially identical to the operation of the FeGFET device previously described (i.e., a device including two non-volatile states distinguished by their respective conductivities can be written by applying an appropriate gate potential, and both can be read without disrupting the state of the device).

In an exemplary embodiment, a FeGFET device was fabricated including a channel layer comprising SRO deposited on an STO substrate without a buffer layer. The device was annealed at 650 degrees Celsius in the presence of oxygen ($O_2$) for ten hours to effect mixing of SRO in the channel layer with STO near the interface with the STO substrate. The channel layer was formed by ion milling the channel region until a substantially thin (e.g., 5 nm) SRO/STO layer was defined. The portion of the SRO not subjected to ion milling was used as a pedestal to anchor the metal electrodes or vias forming the source and drain terminals of the FeGFET device, as shown in FIG. 2A. A lead zirconium titanate (PZT) ferroelectric gate was deposited on top of the SRO/STO channel layer. Standard lithographic and wet etching techniques were then used to open the vias, formed by a first metalization (M1), followed by a second metalization (M2) and subsequently by a third metalization (M3) with platinum (Pt).

Figure 2B:
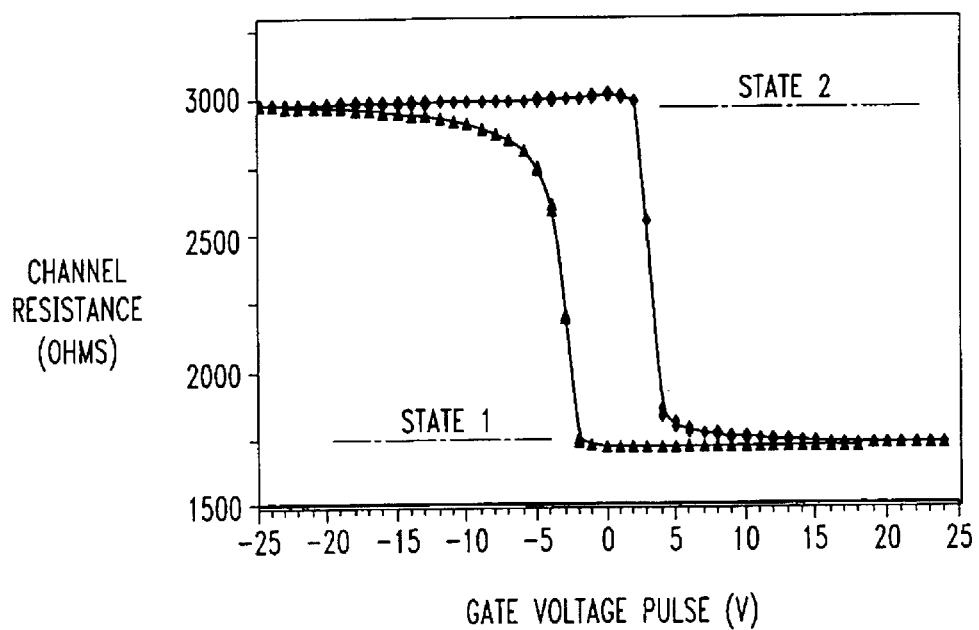
FIG. 2B is a graphical illustration depicting an exemplary hysteresis curve for an oxide-based FeGFET device, formed in accordance with the invention.

The performance of the FeGFET device as a non-volatile memory cell with a nondestructive read was verified by experiment. FIG. 2B depicts a hysteresis curve for the exemplary FeGFET device described above. Channel conductivity (y-axis) was determined after pulsing the gate terminal of the device to positive and negative potentials, as indicated in the x-axis in the figure. The results were obtained at room temperature. As apparent from the figure, the device exhibits two stable states, namely, a low conductivity state, with a resistance of approximately 3000 ohms determined after pulsing the gate terminal to negative voltages (e.g., less than about 2.5 volts), and a high conductivity state, with a resistance of approximately 1700 ohms determined after pulsing the gate terminal to positive voltages (e.g., greater than about 3 volts). The device was shown to be non-volatile for a period of greater than three days and the device did not show fatigue after $10^{10}$ cycles.

As stated previously, conventional non-volatile ferroelectric memory cells are based on either a ferroelectric capacitor or on a FeGFET device. The ferroelectric capacitor, which stores the state of the memory cell, employs ferroelectric material as the dielectric material between the two plates of the capacitor. In contrast, the FeGFET device uses the ferroelectric material as the dielectric (i.e., insulating) material between the gate terminal and the channel of the FeGFET device. Memory cells based on the ferroelectric capacitor have a disadvantage of a destructive read operation. Conventional FeGFET devices are significantly more difficult to fabricate compared to the device of the present invention.

In contrast to conventional FeGFET devices, the FeGFET device of the present invention is based on a structure wherein a relatively highly conducting oxide channel (e.g., SRO) is used as the channel material. The use of this material offers important advantages. First, it is contemplated that the ferroelectric gate dielectric may be grown on the channel layer material (e.g., SRO), and likewise, the channel layer material may be grown on the ferroelectric gate dielectric. Thus, both the gate/PZT/channel FeGFET device and the channel/PZT/gate FeGFET implementations can be easily fabricated according to the invention.

Second, the SRO channel overcomes a problem of integrating the FeGFET device with a silicon channel device. Various attempts have been made to integrate a ferroelectric gate on a silicon channel device. One difficulty with this silicon channel structure is in the growth of a high quality ferroelectric gate dielectric layer on top of the silicon. Since the ferroelectric gate layer must generally be grown in an oxidizing environment, this will lead to the formation of an oxidized silicon dielectric layer in series with the ferroelectric gate layer. The dielectric constant of an oxide of silicon is typically much smaller than the dielectric constant of the ferroelectric gate material. Consequently, when a voltage is applied to the gate, the resulting field which is generated is concentrated primarily on the oxidized silicon dielectric, and hence it is difficult to obtain a sufficient field in the ferroelectric gate layer to switch the polarization state of the ferroelectric gate layer.

Another problem with integrating the ferroelectric gate on silicon is the interdiffusion between the silicon material and the ferroelectric material, which can degrade certain properties of the ferroelectric and silicon materials. By using a conducting oxide channel which is known to integrate with perovskite ferroelectric materials, the present FeGFET device offers significantly improved manufacturing yield. Moreover in contrast to silicon channels, oxide (STO/SRO) channels provide enough carrier density to neutralize the depolarization fields and thus promote ferroelectric retention (see, e.g., P. Wurfel and I. B. Batra, Phys Rev B Vol. 8, 5126 (1973)).

Of the nonvolatile memory alternatives, it is generally accepted that ferroelectric-based non-volatile memory devices offer an advantage over ferromagnetic-based non-volatile memory devices, such as, for example, a magnetic tunnel junction (MTJ) device, in that ferroelectric devices have been shown to be bistable at substantially small dimensions (see, e.g., C. H. Ahn, R. H. Hammond, T. H. Geballe, and M. R. Beasley, J. M. Triscone, M. Decroux, F. Fisher, A. Antognazza and K. Char, *Appl. Phys. Lett.* 70, 206 (1997); C. S. Ganpule, A Stanishevsky, Q. Su, S. Aggarwal, J. Mcingailis, E. Williams, and R. Ramesh, *Appl. Phys. Lett.* 75, 409(1999); C. S. Ganpule, A Stanishevsky, S. Aggarwal, J. Meingailis, E. Williams, R. Ramesh, V. Joshi and Carlos Paz de Araujo, *Appl. Phys. Lett.* 75, 3874 (1999)). This scaling capability is an advantage over ferromagnetic devices, which are harder to scale to smaller dimensions due to the presence of a superparamagnetic limit, below which a small magnetic domain is very sensitive to thermal fluctuations.

The physical properties of the oxide-based FeGFET lend themselves to low voltage memory technology for several reasons including, for instance, the fact that: (i) the resistance of the FeGFET device can be adjusted, over a wide range, by varying the respective proportions of SRO and STO in the channel region since SRO, the conductor dopant, and STO, the insulator, are miscible; and (ii) the coercive voltage (around four volts for the discrete FeGFET device) can be lowered by reducing the thickness of the ferroelectric gate dielectric layer (e.g., PZT). Given a linear electric field across the ferroelectric gate dielectric layer (i.e., all dipole moments aligned), the coercive voltage will be substantially linearly proportional to the thickness of the ferroelectric gate dielectric layer. Thus, the coercive voltage, or write voltage, of the FeGFET device according to the present invention can be scaled to one volt or less simply by reducing the ferroelectric gate dielectric layer thickness. A FeGFET device having a coercive voltage of less than one volt is highly desirable in that the CMOS device will also be scaled below one volt. In conventional non-volatile memory devices, charge pumps are typically required to boost the write voltage of Flash technology. Such charge pumps consume a large amount of die/chip area and a significant amount of power. The techniques of the present invention advantageously eliminate the need for such charge pumps.

Figure 3:
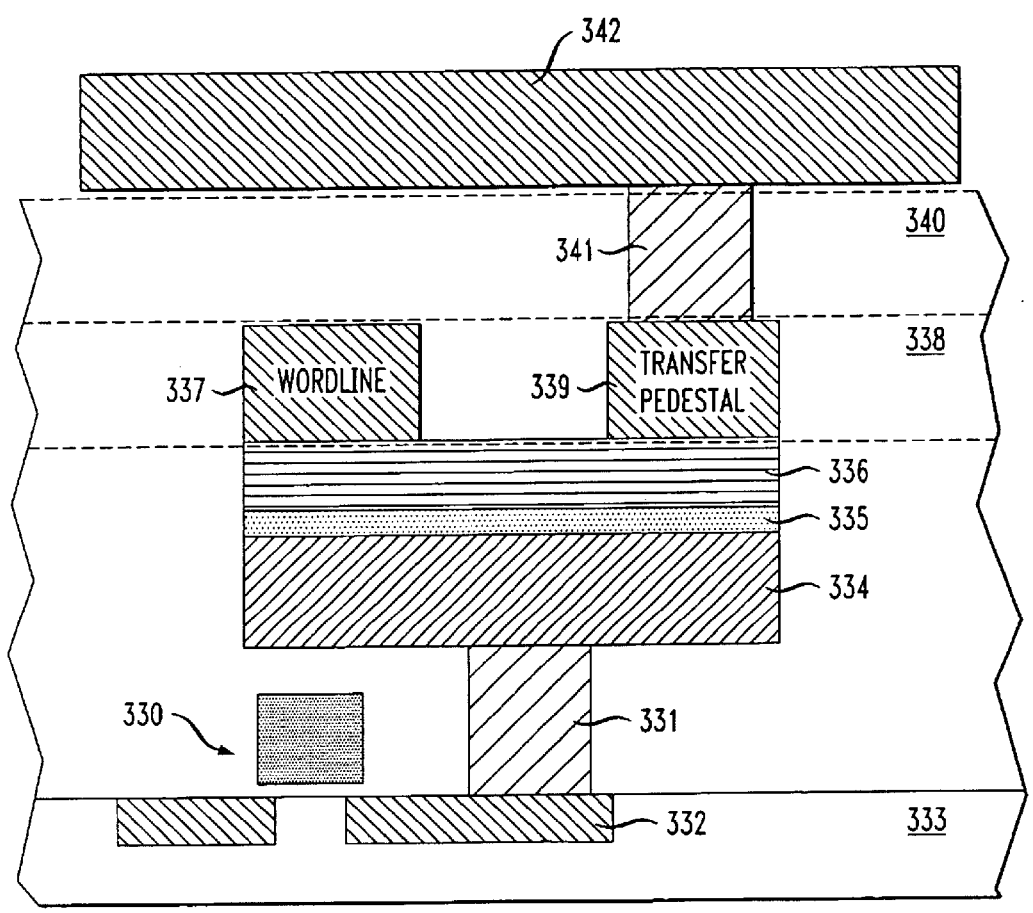
FIG. 3 is a cross-sectional view depicting a planar FeGFET device integrated with a silicon field effect transistor (FET), formed in accordance with the invention.

FIG. 3 depicts an exemplary integration of a planar (i.e., horizontal) FeGFET device with a corresponding silicon FET device, formed in accordance with another aspect of the invention. The integration of the FeGFET device with the silicon FET device may be used, for example, in a non-volatile memory cell. The planar FeGFET device may be similar in structure to that previously described in connection with FIG. 2A. Initially, a silicon FET device 330 is fabricated on a silicon substrate 333, for example, using conventional integrated circuit (IC) fabrication techniques. A contact 331 is preferably formed on, and in electrical connection with, a drain (or a source) region 332 of the silicon FET device. Since a FET is a bidirectional device, the designation of drain and source regions of the device is essentially arbitrary. Consequently, rather than referring to individual drain or source terminals, these terminals will be referred to herein as first and second drain/source terminals. A gate 334 of the FeGFET device is preferably deposited on the contact 331 after the contact is filled. The material used to form the gate 334 is preferably a metal, such as, for example, platinum (Pt), iridium (Ir), or iridium oxide, although alternative conducting materials may be employed.

A ferroelectric gate dielectric layer 335 of a predetermined thickness (e.g., about 100 nm to 300 nm) is preferably deposited or grown on an upper surface of the gate 334. As previously stated, the ferroelectric gate dielectric layer may be formed of PZT or a suitable alternative material. A channel layer 336 is then deposited or grown on an upper surface of the ferroelectric gate dielectric layer 335. Both the ferroelectric gate dielectric layer 335 and the channel layer 336 may be deposited either by, for example, PLD, sputtering, chemical solution deposition (CSD), or CVD. The three layers 334, 335, 336 may then be patterned by a combination of dry and wet lithography processing, as will be known by those skilled in the art. It is to be appreciated that, in comparison to the FeGFET structure shown in FIG. 2A, at least a portion of the layers comprising the FeGFET device of FIG. 3 are formed in a reverse order. Forming the FeGFET device in this manner allows the FeGFET device to be more easily integrated with the silicon FET device.

A layer of dielectric material 338 is preferably deposited or grown on the channel layer 336. Using a conventional lithographic process, the dielectric layer 338 is patterned to define predetermined areas, which are then etched in a conventional manner (e.g., chemical etching, etc.), and the resulting openings are preferably filled with a metal to form, for example, a wordline 337 and a transfer pedestal 339, as shown. This step defines the channel length, measured between the wordline and transfer pedestal. Alternatively, the channel length may be defined by thinning the channel region, for example, by ion milling or reactive ion etching (RIE), before the dielectric layer 338 is deposited.

Another layer of dielectric material 340 is preferably deposited or grown on an upper surface of dielectric layer 339. Dielectric layer 340 is then preferably planarized to provide a substantially horizontal surface upon which to form a metal interconnect, such as, for example, a read bit line 342. An opening is formed in dielectric layer 340 for creating a electrically conductive via 341. The via 341 is formed by filling the opening in the dielectric layer 340 with, for example, a metal (e.g., aluminum, etc.). The via 341 electrically connects the read bit line 342 with the channel layer 336 by way of the transfer pedestal 339.

Figure 4:
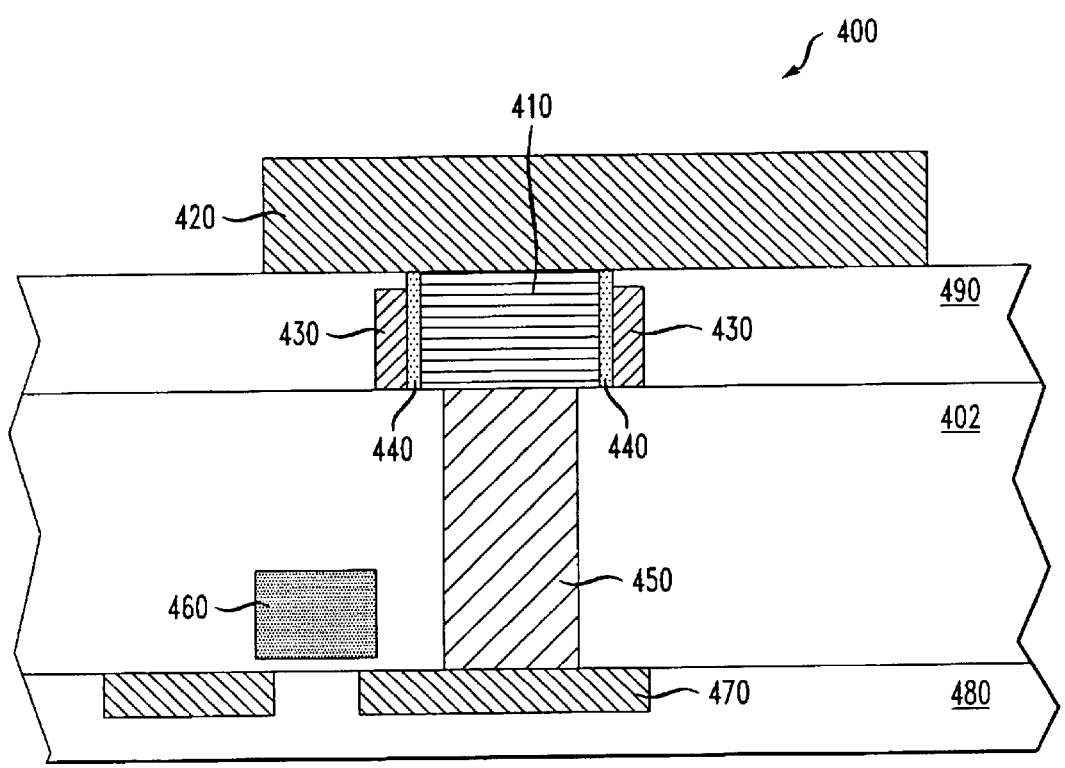
FIG. 4 is a cross-sectional view depicting an exemplary vertical FeGFET device integrated with a silicon field effect transistor (FET), formed in accordance with another aspect of the invention.

In order to improve density, FIG. 4 illustrates an exemplary integration of a vertical FeGFET device with a silicon FET device, in accordance with one aspect of the invention. This structure 400 may be used, for example, in a non-volatile memory cell. As apparent from the figure, the illustrative FeGFET device in this embodiment may be fabricated between two interconnect levels in a vertical dimension. Forming the FeGFET device in this manner is desirable in that it allows the device to have a reduced horizontal dimension associated therewith, so as to enable adjacent devices to be spaced in close proximity relative to one another.

The illustrative memory cell 400 preferably comprises a conventional silicon FET 460 formed on a silicon substrate 480. A dielectric isolation layer 402 (e.g., silicon dioxide) is preferably grown or deposited over the entire FET device so as to form a substrate having a substantially planar surface for supporting the FeGFET device. In a manner consistent with the fabrication of the planar FeGFET cell previously described in conjunction with FIG. 3, a vertical FeGFET device is preferably formed directly above a corresponding silicon FET device. The vertical FeGFET includes a channel region 410, a ferroelectric gate dielectric region 440 and a gate terminal 430. A source area (e.g., bottom surface) of the channel 410 is connected to the drain area 470 of the silicon FET through an interconnect via 450. A drain area (e.g., top surface) of the channel 410 is preferably connected to a metal interconnect 420 formed on an upper surface of the FeGFET device. Thus, the vertical FeGFET device is fabricated between these two metal interconnect levels 450, 420, and conduction is controlled by the gate terminal 430 with ferroelectric gate dielectric 440. It is to be understood that the vertical FeGFET device of the present invention is not limited to the precise structure shown in FIG. 4.

Figure 5:
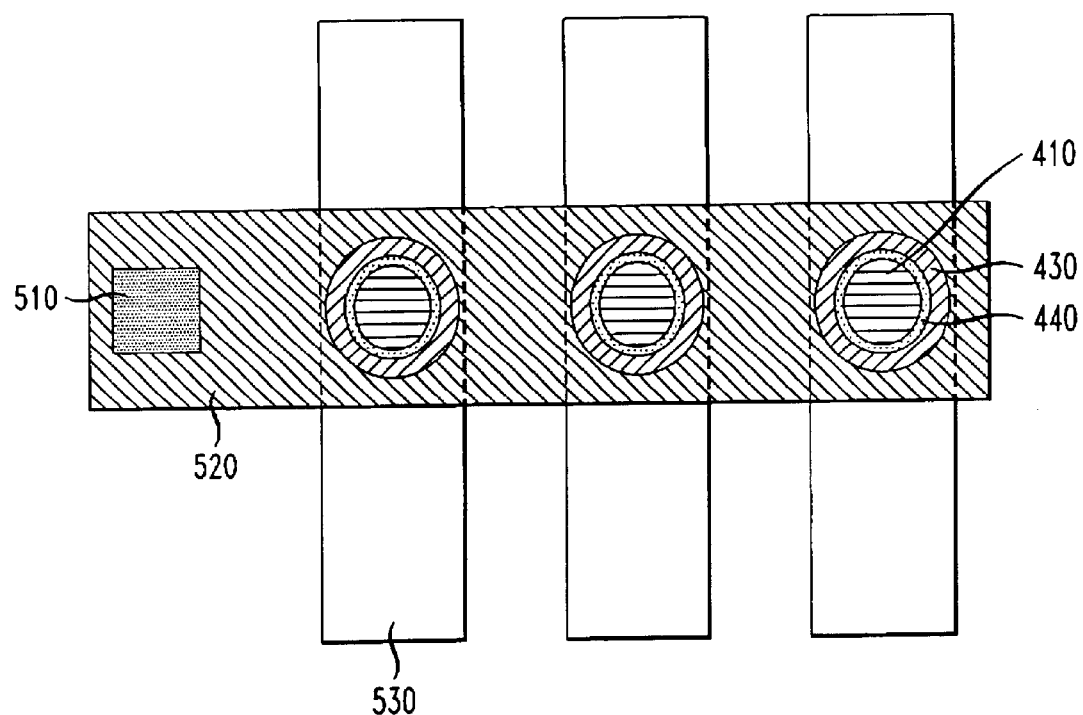
FIG. 5 is a top plan view illustrating at least a portion of a memory array including a plurality of vertical FeGFET memory cells, formed in accordance with the present invention.

FIG. 5 depicts a top plan view illustrating at least a portion of a memory array including a plurality of vertical FeGFET memory cells. As shown in FIG. 5, both the gate terminal 430 and the ferroelectric gate dielectric 440 are preferably fabricated as at least a partial ring substantially surrounding the channel region 410 of the vertical FeGFET device. The ring structure seeks to optimize a channel length in a minimal horizontal dimension. It is to be appreciated, however, that the vertical FeGFET device is not limited to the exact structure shown, but may be fabricated in an alternative arrangement, as will be understood by those skilled in the art. As apparent from the figure, the gate terminals 430 of each of the FeGFET devices are preferably formed of a common gate conductor 520 (e.g., Pt or Ir), much like a word line is used to connect multiple memory cells. The common gate conductor may be connected to other conductors via a gate contact 510, or via alternative means. A plurality of program bit line conductors 530 (e.g., aluminum) coupled to each of the vertical FeGFET devices are also included for reading or writing the state of the FeGFET device. These bit line conductors 530 are essentially the same as the metal interconnect 420 shown in FIG. 4. As previously stated, since the vertical FeGFET device is fabricated in the via of the interconnect, the density of a memory array employing this cell structure is significantly improved. Minimum metal pitch can be used as a bit line in the memory array to compete with the high density DRAM arrays.

Figure 6A:
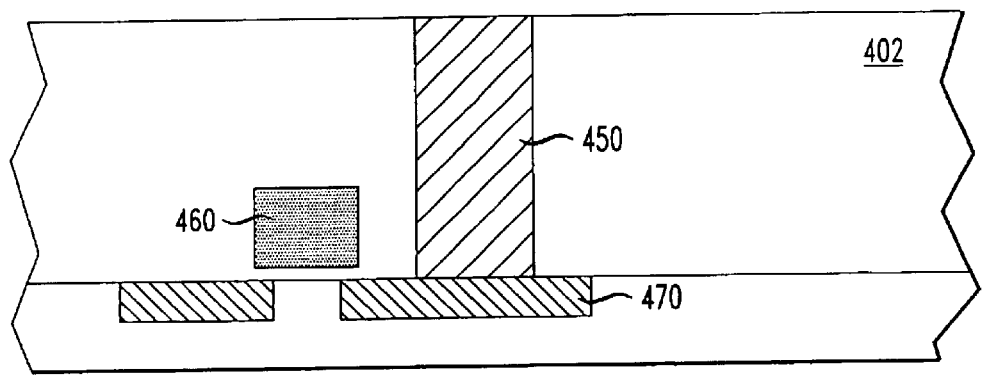
FIGS. 6A through 6F are cross-sectional views depicting a sequence of illustrative processing steps which may be used to fabricate an integrated vertical FeGFET/silicon FET device, in accordance with the present invention.

FIGS. 6A through 6F depict illustrative processing steps for fabricating an integrated vertical FeGFET/silicon FET cell described above in conjunction with FIG. 4. With reference now to FIG. 6A, the conventional silicon FET device 460 is shown with an interconnect via 450 formed on, and in electrical connection with, the drain region 470 of the silicon FET. Interconnect via 450 may be formed in the planarized inter-level dielectric isolation layer 402 by creating an opening in the dielectric isolation layer 402 and filling the opening with metal (e.g., aluminum) in a subsequent processing step.

Figure 6B:
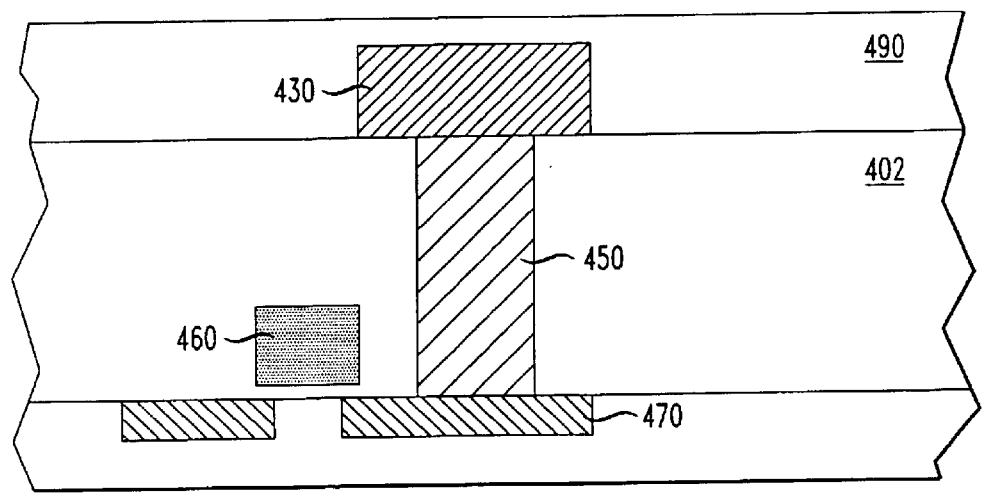

As shown in FIG. 6B, a layer 430 of, but not limited to Pt, Ir, or Pt-Ir alloy is preferably formed on the interconnect via 450. This layer 430, which will form the gate terminal of the corresponding FeGFET device, is deposited, and then patterned and etched, e.g., with a dry etching process, as previously explained. A layer of dielectric material 490 (e.g., silicon dioxide), which is commonly used for inter-level dielectric isolation, is preferably deposited or grown over an upper surface of the structure in a planarizing step.

Figure 6C:
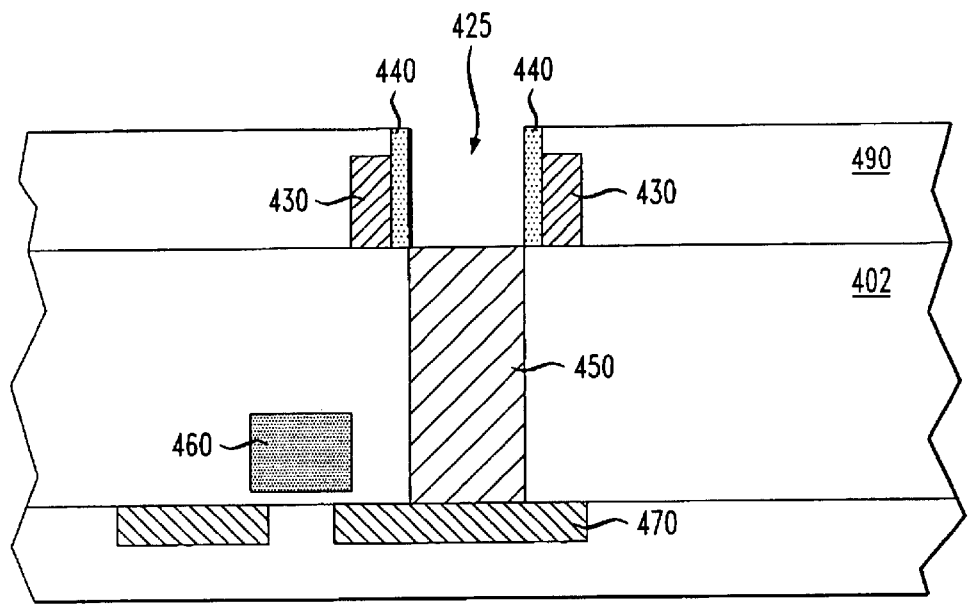

As shown in FIG. 6C, an opening 425 is preferably formed through the dielectric layer 490 and Pt, Ir, or Pt-Ir layer 430. The opening may be formed, for example, by patterning the dielectric layer 490 using a conventional lithography step, followed by an etching step (e.g., wet etching, dry etching, RIE, etc.). Etching is preferably stopped when an upper surface of the interconnect via 450 is exposed. Subsequently, a ferroelectric oxide layer 440 of a predetermined thickness is deposited over the surface of the structure and then etched through a lithographic mask. The etching may be a directional dry etching process, as will be understood by those skilled in the art. The ferroelectric oxide sidewalls 440 form the gate of the vertical FeGFET device.

Figure 6D:
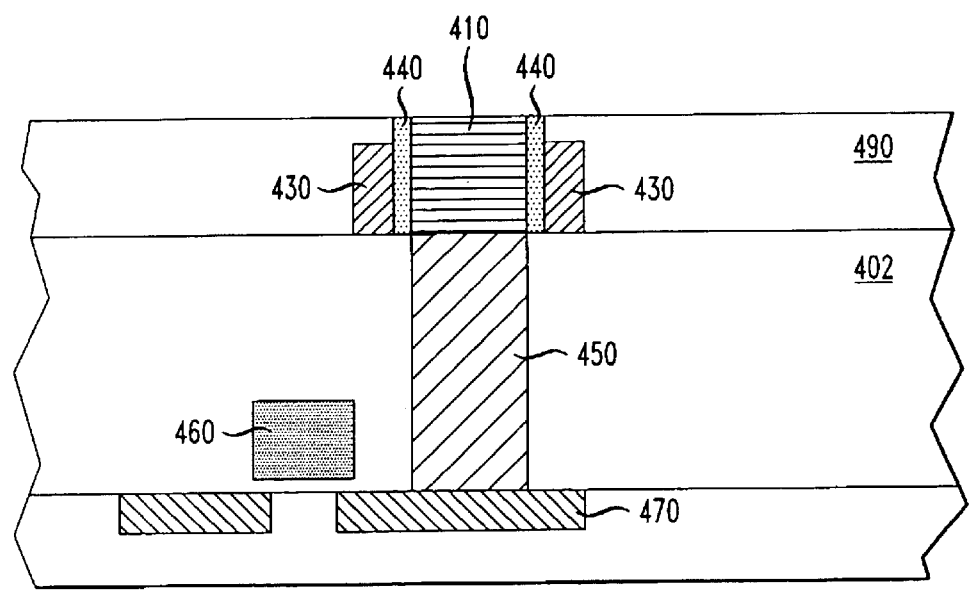

In FIG. 6D, the oxide channel material, for instance SRO/STO, is deposited in opening 425 by way of a deposition step, such as, for example, CVD, epitaxial deposition plasma deposition, etc. In an alternative embodiment shown in FIG. 6E, the center of the oxide channel region is removed (e.g., by an etch process) and filled with a plug 414 so that a majority of conduction occurs at an interface between the channel region 410 and the gate dielectric 440, the region where the field of the ferroelectric dipole can penetrate and thus influence channel conductivity. The plug 414 is preferably formed of a dielectric material, such as, for example, oxide. With a device formed in this manner, the center of the channel region 410 is shielded from the field of the ferroelectric dipole, and thus its resistance is not substantially modulated by the ferroelectric dipole. If the center region were not removed (as is the case in FIG. 6D), the variation in resistance of the channel region would be minimized due the presence of an invariant conductance at the center of the channel (i.e., an invariant resistance at the center of the channel in parallel with a modulated resistance at the interface between the channel 410 and the ferroelectric gate 440).

Figure 6E:
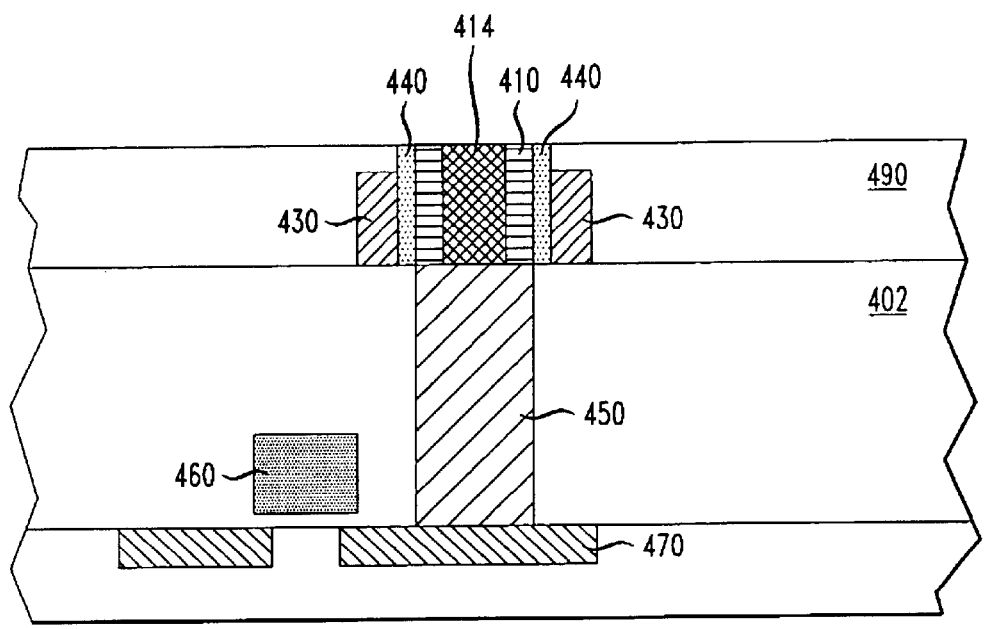

As previously stated, the structure of FIG. 6E can be formed by subtracting the center of the channel region 410 using, for example, a dry or wet etching process completely through the channel region 410, and then filling the remaining hole with a dielectric plug 414 in a deposition step. After the deposition step, a polishing step is preferably performed, such as, for example, by chemical or mechanical polishing, to form a substantially planar upper surface of the structure. A metal layer is then deposited on the upper surface of the structure and patterned, using, for example, conventional metalization techniques, in order to form the interconnect 420, shown in FIG. 4.

Figure 6F:
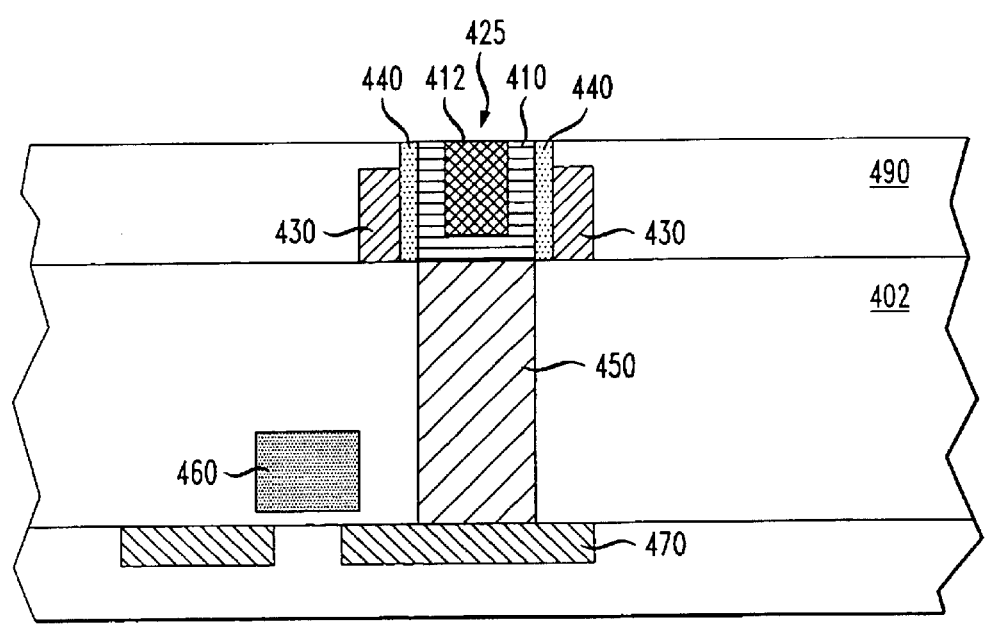

A preferred embodiment of the vertical FeGFET device is illustrated in FIG. 6F, in accordance with the invention. In this embodiment, the FeGFET is preferably fabricated including a conformal deposition of a thin layer oxide (e.g., STO/SRO) layer over the surface of the device, which becomes a U-shaped channel region 410. This conformal deposition step can be accomplished by a non-directional deposition to an average layer thickness less than that of the dielectric layer 490, or alternatively by a chemical solution deposition at a suitable spinning velocity, as will be appreciated by those skilled in the art. The latter steps are preferably followed by a conformal deposition of a thick insulating layer over the oxide surface, which ultimately becomes an insulating plug 412 at the center of the U-shaped channel 410. As apparent from the figure, in this embodiment, the plug 412 does not pass completely through the channel region 410. After the deposition step, a polishing step is preferably performed, such as, for example, by chemical or mechanical polishing, to remove the insulating layer and the oxide layer from the surface, leaving the insulating and oxide layers only in the opening 425, and to create a substantially planar upper surface upon which additional interconnect layers may be formed. A metal layer is then deposited on the upper surface of the structure and patterned, using, for example, conventional metalization techniques, in order to form the interconnect 420 shown in FIG. 4.

Figure 7:
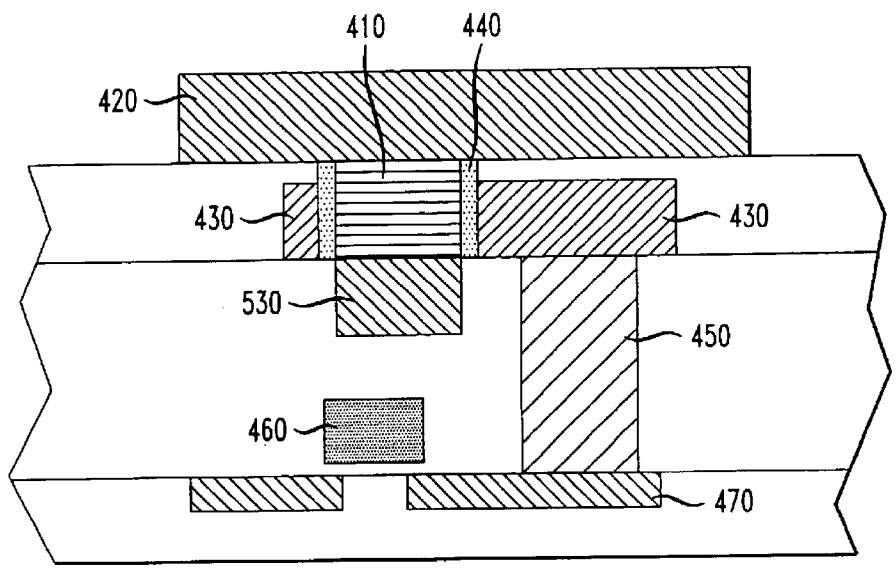
FIG. 7 is a cross-sectional view illustrating an alternative vertical FeGFET device structure having an elongate gate, formed in accordance with the present invention.

It is to be appreciated that, in accordance with the present invention, various alternative configurations of the vertical FeGFET device are contemplated, as will be understood by those skilled in the art. For example, FIG. 7 depicts a vertical FeGFET device wherein the gate 430 of the FeGFET may be elongated at one end and operatively connected to the drain/source terminal 470 of a conventional silicon FET 460 by way of a conductive via 450. One end of the FeGFET channel 410 (e.g., either the drain or source region) is connected to the metal interconnect 420, and the other end of the FeGFET channel 410 is connected to metal conductor 530. Metal interconnect 420 and metal conductor 530 may serve as a word line and bit line, respectively, in a memory array.

Figure 8:
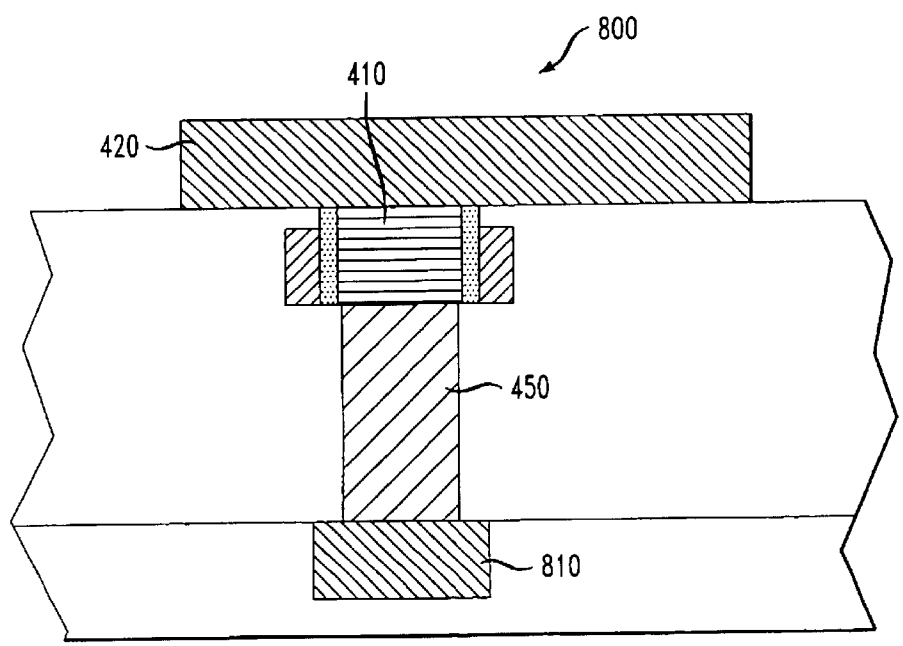
FIG. 8 is a cross-sectional view depicting an alternative vertical FeGFET device coupled between two metal interconnect layers, formed in accordance with the present invention.

FIG. 8 depicts an alternative embodiment of the vertical FeGFET device 800 connected between an upper metal interconnect 420 and a lower metal interconnect 810 through interconnect via 450. The present invention further contemplates that the channel 410 of the FeGFET device may be sandwiched between and electrically connected to any two planar interconnect wires (e.g., 420 and 810), and that an interconnect via (e.g., 450) can be selectively utilized to connect the planar interconnect wires to the drain and source ends, respectively, of the FeGFET channel 410.

Figure 9A:
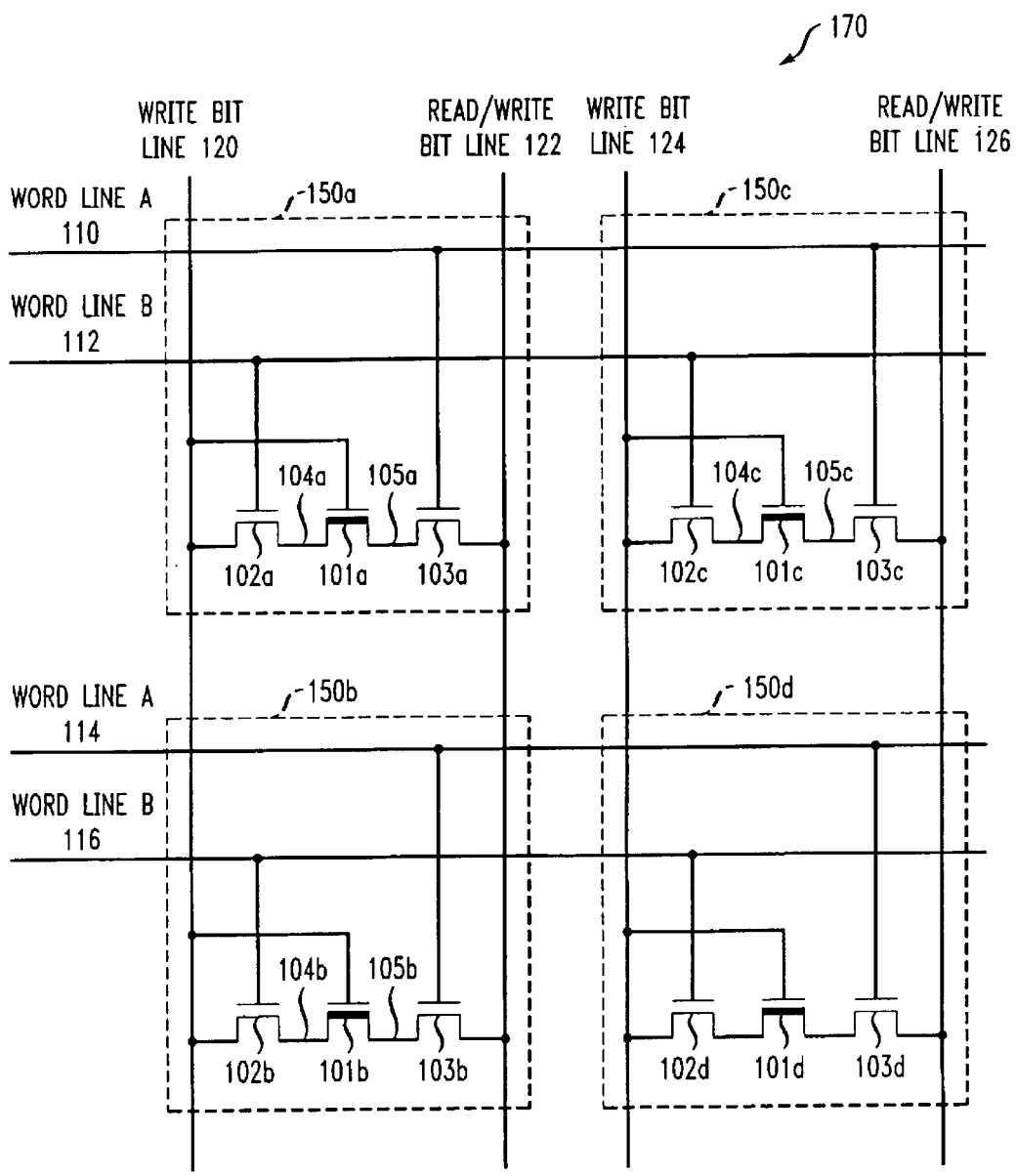
FIG. 9A is a schematic diagram illustrating at least a portion of an exemplary non-volatile memory array including a plurality of dual FET/single FeGFET memory cells, formed in accordance with one embodiment of the present invention.

The implementation of the inventive FeGFET device, as described above, in an illustrative non-volatile memory array will now be discussed. FIG. 9A illustrates at least a portion of an exemplary memory array, formed in accordance with one aspect of the invention. The memory array 170 includes a plurality of memory cells 150a, 150b, 150c and 150d operatively coupled to corresponding word lines 110, 112, 114 and 116, write bit lines 120 and 124, and read/write bit lines 122 and 126, as shown, for selectively writing and/or reading the logic state of one or more of the memory cells. Each of the memory cells 150a, 150b, 150c and 150d preferably comprises a corresponding FeGFET device 101a, 101b, 101c and 101d, and a pair of corresponding FET devices 102a and 103a, 102b and 103b, 102c and 103c, and 102d and 103d, respectively. The FeGFET device in each memory cell serves as the non-volatile memory element, retaining the logical state of a given cell without an expenditure of energy. The FET devices in each memory cell are operatively coupled to a corresponding FeGFET device associated with the cell and provide independent read and write access to the FeGFET device. It is to be appreciated that each of the FET devices functions generally as a pass gate and, in fact, may be implemented using alternative switching circuitry, such as, for example, a multiplexor.

It is to be appreciated that word lines 110, 112, 114, 116 and bit lines 120, 122, 124, 126 associated with the memory array 170 are preferably operatively coupled to corresponding word drivers and bit drivers/multiplexors (not shown), respectively, for selectively writing and/or reading the state of one or more of the memory cells in the array. These word and bit drivers, which can be implemented in a conventional manner, may further connect to other peripheral circuits, such as, for example, decoders, write circuits and/or read circuits (e.g., sense amplifiers), as will be understood by those skilled in the art.

As apparent from the figure, for any given memory cell 150a, the pair of FET devices 102a, 103a are preferably connected such that a first terminal (drain or source) of one FET 102a is coupled to a write bit line 120 and a second terminal (source or drain) of the FET 102a is coupled to a first terminal (drain or source) of the FeGFET device 101a at node 104a. Likewise, a first terminal (drain or source) of the other FET 103a is coupled to a read/write bit line 122 and a second terminal (source or drain) of the FET 103a is coupled to a second terminal (source or drain) of the FeGFET 101a at node 105a. A gate terminal of each of the FET devices 102a and 103a is preferably coupled to a corresponding word line 112 and 110, respectively. A gate terminal of the FeGFET 101a is preferably coupled to write bit line 120. In this manner, the gate terminal of the FeGFET 101a may be electrically connected to the drain or source terminal of the FeGFET 101a when FET 102a is active, such as during a first mode of operation of memory cell 150a.

With continued reference to FIG. 9A, the operation of the exemplary memory array 170 will now be described. By way of illustration only, read and write operations will be applied to memory cell 150a only, which will be referred to herein as a "selected" memory cell. It is to be appreciated, however, that the techniques of the present invention described herein may be similarly applied to any memory cell(s) in the memory array. One or more memory cells other than the selected memory cell 150a may be connected to the same word lines 110, 112 corresponding to the selected cell and are referred to herein as "half selected" memory cells (e.g., cell 150c). The independence of these other cells along a selected word line in response to a read or write operation directed to the selected cell 150a will be demonstrated. Likewise, in the bit (vertical) dimension, independence is demonstrated by showing that all memory cells other than the selected memory cell 150a are held in a "standby" mode. It is also contemplated that more than one memory cell in memory array 170 can be accessed along the selected word line.

Preferably, each of the memory cells in the memory array is operational in at least a standby mode, a read mode, or a write mode, as will be explained in further detail below. In a standby mode of operation, the state of the memory cell, which is stored within the FeGFET device, is protected (i.e., maintained). A robust bistable state for the FeGFET device is preferably obtained by reducing the electric field across the ferroelectric gate dielectric layer in the device to substantially zero. This may be accomplished, for example, by electrically connecting the gate, drain and source terminals of the FeGFET device to a common potential, thereby maintaining a uniformity of the electric dipole orientation of the ferroelectric gate dielectric layer in the device. The absence of fields prevents field-induced reversal of any domains (in other words electric dipoles) within the FeGFET devices, thus preserving the states of all memory cells in the memory array. During a write operation of a selected memory cell, an electric field is selectively applied to the ferroelectric gate dielectric layer of the FeGFET device associated with the selected memory cell in order to reverse the electric dipole orientation of the FeGFET, as will be explained in further detail below.

In the exemplary memory array 170, each of the memory cells 150a through 150d are preferably in the standby mode when word lines 110 and 114 are at a logic low ("0"), such as a negative voltage supply of the memory array, and word lines 112 and 116 are at a logic high ("1"), such as a positive voltage supply of the memory array. In the standby mode, FET devices 102a through 102d are active (i.e., enabled), while FET devices 103a through 103d are inactive (i.e., disabled). In this standby mode, each of the memory cells is configured such that a first drain/source terminal of the corresponding FeGFET device is electrically connected to its gate terminal (i.e., shunted) and a second drain/source terminal of the FeGFET device would essentially be floating if it were not for the conducting channel of FeGFET 101a. Since the FeGFET has a conducting channel, regardless of the dipole orientation (e.g., either the FeGFET channel is conducting or highly conducting; see FIG. 2B), the first drain/source terminal of the FeGFET charges the second drain/source terminal of the FeGFET through the conducting channel of the FeGFET. Considering the fact that the write bit line connects the gate terminal of the FeGFET to the first drain/source terminal of the FeGFET, then in standby mode, all three terminals qf a given FeGFET device will charge to the same potential, namely, the potential of the corresponding write bit line (120 or 124) associated therewith.

With continued reference to FIG. 9A, a read operation directed to a selected memory cell 150a will now be discussed. In the following discussion, it will be assumed that all memory cells, including selected memory cell 150a, begin in the standby mode. To select a row, which may be defined as including memory cells along a word line (horizontal) dimension, containing memory cell 150a for a read operation, word line A 110 is preferably driven to a logic high, from its standby logic low state, and word line B 112 is maintained at a logic high state. Both FETs 102a and 103a associated with memory cell 150a are active in this instance, thus shunting nodes 104a and 105a to write bit line 120 and read/write bit line 122, respectively. In other words, the gate terminal and the first drain/source terminal of FeGFET 101a will be electrically connected to write bit line 120, and the second drain/source terminal of FeGFET 101a will be electrically connected to read/write bit line 122. The conducting channel of FeGFET 101a operatively couples the read/write bit line 122 to the write bit line 120, providing the primary conduction path between the two bit lines 120 and 122.

Other memory cells connected along the same column, which may be defined as including memory cells along a bit line (vertical) dimension, for example memory cell 150b, are open-circuited by a disabled FET 103b, since word line A 114 is preferably held at logic low. In a similar fashion, FETs 102c and 103c associated with memory cell 150c operatively connect nodes 104c and 105c to write bit line 124 and read/write bit line 126, respectively. The channel of FeGFET 101c provides the primary conduction path between read/write bit line 126 and write bit line 124.

Figure 9B:
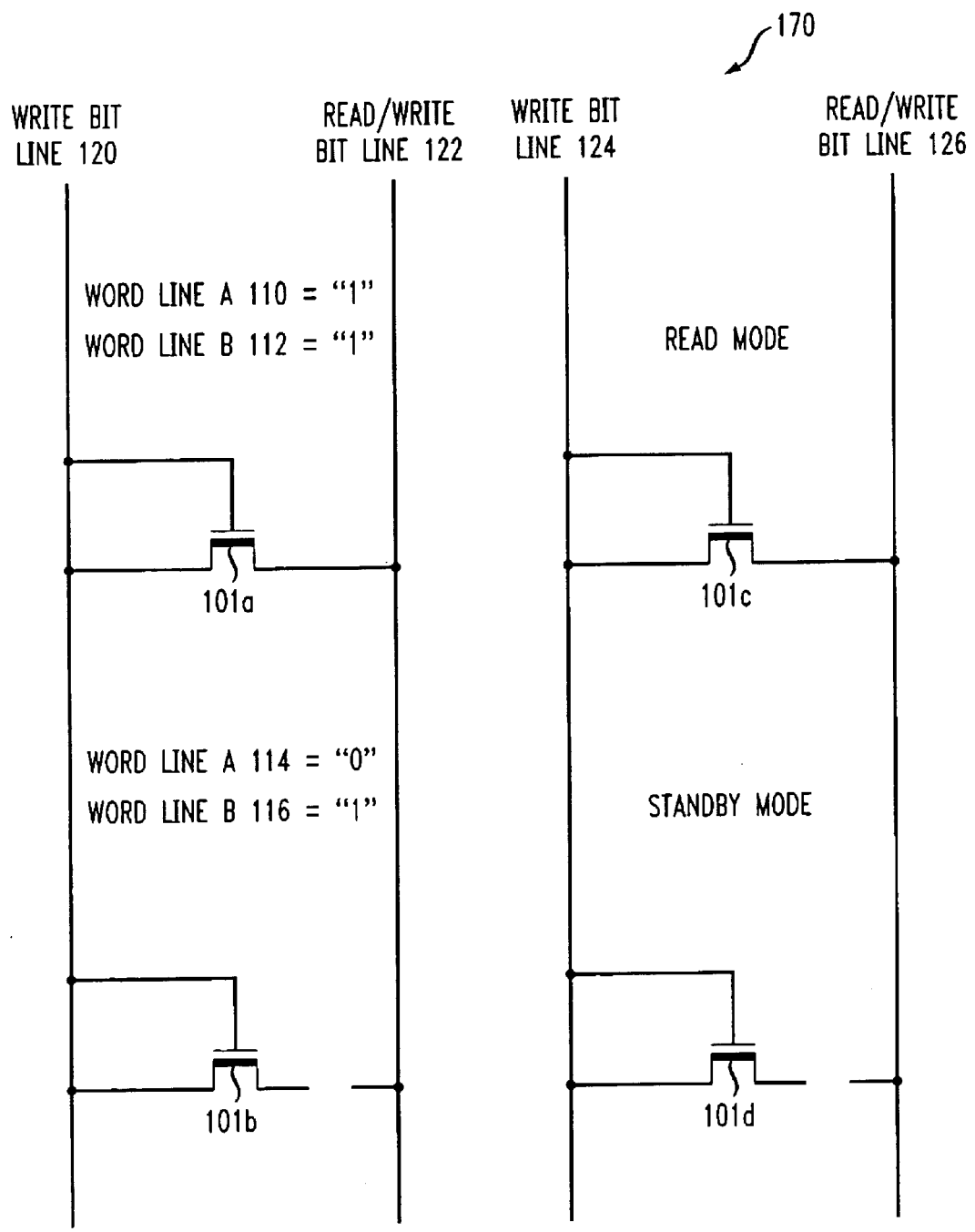
FIG. 9B is a schematic diagram illustrating is functional circuit arrangement of the memory array shown in FIG. 9A, configured for a read operation.

FIG. 9B illustrates the exemplary memory array 170 configured in the manner previously described, namely, with selected memory cell 150a in a read mode of operation. This figure is essentially the same as FIG. 9A, with the exception that all FETs 102a through 102d and 103a through 103d have been removed for ease of explanation and replaced by their functional equivalent circuits, namely, either a short circuit, corresponding to an active FET (e.g., FETs 102a through 102d, 103a and 103c), or an open circuit, corresponding to an inactive FET (e.g., FETs 103b and 103d).

By way of example only, a sense amplifier (not shown), such as that disclosed in U.S. Pat. No. 6,191,989 [to Luk et al., may be employed to evaluate the state of the datum stored in a given FeGFET (e.g., 101a) associated with a selected memory cell 150a. The sense amplifier may be operatively connected to the memory array, for example as taught by U.S. Pat. No. 6,269,040 to Reohr et al., although alternative connection arrangements are contemplated. One bit line, such as, for example, write bit line 120, can be connected to ground (or another DC potential). Another bit line, such as, for example, read/write bit line 122, can either be directly connected to the sense amplifier or operatively connected to the sense amplifier, for example, via a multiplexor that selects an active bit line from a plurality of bit lines based on a given column address.

In either case, the sense amplifier preferably measures the conductance of the channel of the selected FeGFET 101a and compares it with a reference FeGFET having a channel conductance which is preferably configured to be halfway between a highly conductive channel, corresponding to a first logic state (e.g., a "1" state), and a conductive channel, corresponding to a second logic state (e.g., a "0" state). The sense amplifier may perform this measurement in at least one of two ways: (1) by forcing a voltage on read/write bit line 122 and measuring a corresponding current flowing through the channel of FeGFET 101a; or (2) by driving a current through the channel of FeGFET 101a and measuring the corresponding voltage on read/write bit line 122. It is to be appreciated that alternative techniques may be employed for determining the conductance, and thus the logical state, of a particular memory cell(s) in the memory array, as will be understood by those skilled in the art.

Figure 9C:
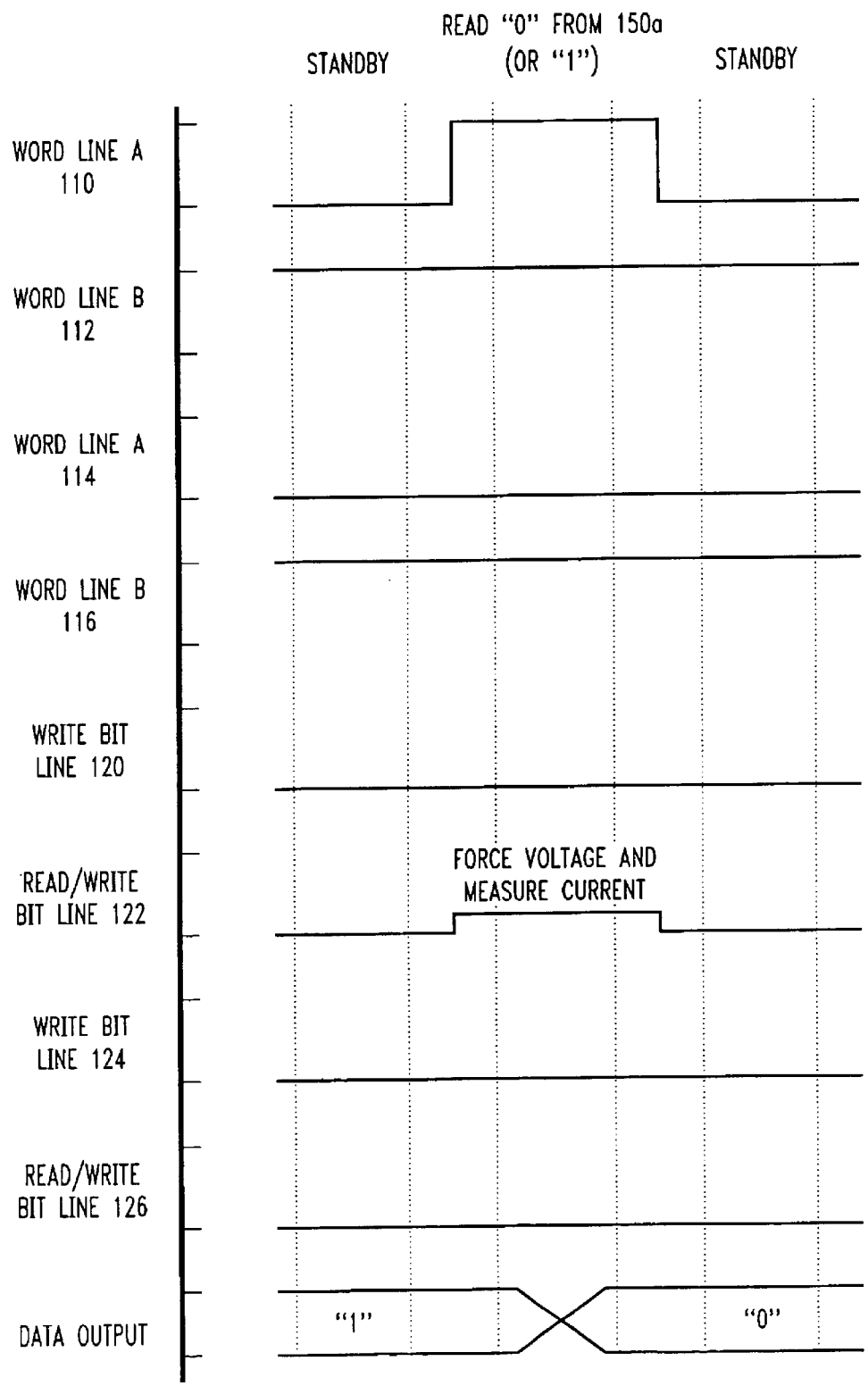
FIG. 9C is a logical timing diagram depicting preferred signals for reading a selected memory cell within the memory array shown in FIG. 9A.

FIG. 9C is an illustrative timing diagram depicting preferred signals for reading the contents of a selected memory cell 150a within the memory array 170 of FIG. 9A, in accordance with the present invention. These signals cause memory cell 150a to transition from a standby mode, to a read mode, and then back to a standby mode. As previously described, word lines 114 and 116 correspond to unselected memory cells and therefore word line 114 is held low and word line 116 is held high, thereby maintaining a standby mode for memory cells 150b and 150d. Similarly, write bit line 124 and read/write bit line 126 correspond to unselected memory cells and therefore these bit lines are held low. Consequently, memory cell 150c is set in a standby mode.

Referring again to FIG. 9A, a write operation directed to a selected memory cell 150a will now be discussed. As in the case of the read operation, it will be assumed that all memory cells, including selected memory cell 150a, begin in the standby mode. Writing a selected memory cell preferably involves directing a positive or negative differential voltage across the selected memory cell, wherein the differential voltage has sufficient magnitude to write the dipole of the FeGFET device within the selected memory cell to a new state. Other unselected memory cells within the memory array retain their prior states.

To select a row, which may be defined as including memory cells along a word line (horizontal) dimension, containing memory cell 150a for a write operation, word line A 110 is preferably driven to a logic high, from its standby logic low state, and word line B 112 is driven to a logic low, from its standby logic high state. FET 102a is therefore disabled and FET 103a is enabled. As a consequence, node 105a is shunted to read/write bit line 122 and node 104a is electrically disconnected from write bit line 120. In other words, the gate terminal of FeGFET 101a will be electrically connected to write bit line 120, the first drain/source terminal of FeGFET 101a will be electrically connected to node 105a through the conducting channel of FeGFET 101a, and the second drain/source terminal of FeGFET 101a will be electrically connected to read/write bit line 122. Thus, the conducting channel of FeGFET 101a is electrically tied to the read/write bit line 122 and the gate terminal of FeGFET 101a is connected to write bit line 120.

Other memory cells, not including the selected memory cell 150a, connected along the same column, which may be defined as including all memory cells along a bit line (vertical) dimension, for example memory cell 150b, remain in a standby mode, since word line A 114 is preferably held at a logic low. Thus, an unselected memory cell 150b not connected to the selected word lines 110, 112 will be electrically disconnected from a corresponding read/write bit line 122 by a disabled FET 103b. Likewise, a given memory cell 150c that is connected to the selected word lines 110, 112 could also be written, since it is in a write mode, if it were not for the fact that in this case write bit line 124 and read/write bit line 126 are held low.

Figure 9D:
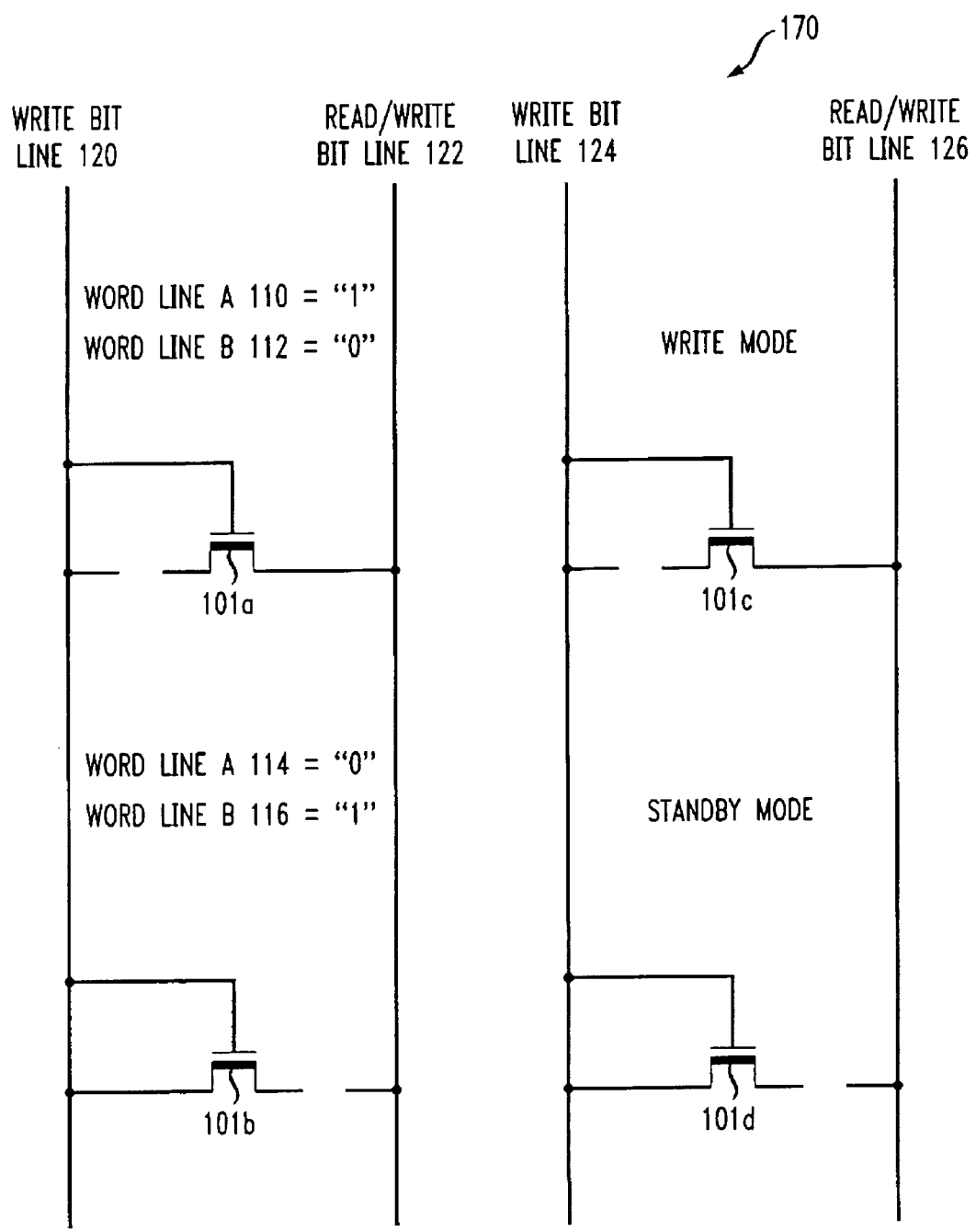
FIG. 9D is a schematic diagram illustrating is functional circuit arrangement of the memory array shown in FIG. 9A, configured for a write operation.

FIG. 9D illustrates the exemplary memory array 170 configured in the manner described above, namely, with selected memory cell 150a in a write mode of operation. This figure is essentially the same as FIG. 9A, except that all FETs 102a through 102d and 103a through 103d have been replaced by their functional equivalent circuits, specifically, either a short circuit, corresponding to an active FET (e.g., FETs 102b, 102d, 103a, 103c), or an open circuit, corresponding to an inactive FET (e.g., FETs 102a, 102c, 103b, 103d).

While in the write mode, to write FeGFET 101a, a positive or negative differential voltage potential, representing a desired datum state (e.g., a logic "1" or "0,"

respectively), is preferably applied between write bit line 120 and read/write bit line 122. With the gate terminal of FeGFET 101a connected to write bit line 120 and the second drain/source terminal of FeGFET 101a connected to read/write bit line 122, this applied voltage potential creates a field across the ferroelectric insulator of FeGFET 101a, thereby aligning the electric dipole of the FeGFET 101a with the applied field. Other unselected memory cells connected along the same column, for example, memory cell 150b, are held in the standby mode, wherein all terminals of the corresponding FeGFETs, for example, FeGFET 101b, are electrically shunted to write bit line 120. Consequently, since there is an absence of an applied field across the unselected memory cells, these cells are virtually unaffected by the applied voltage potential.

If desired, memory cell 150c, which is connected to the same word lines as selected memory cell 150a, can be written in a similar fashion as memory cell 150a. In this instance, a second positive or negative differential voltage would be applied between write bit line 124 and read/write bit line 126. Setting the second positive or negative differential voltage to zero maintains the prior state stored in a given FeGFET. Memory cell, selected for write mode in the wordline dimension, can also be kept in standby mode, by guaranteeing that write bit line 124 and read/write bit line 126 are held to the same potential, in the preferred case the lowest voltage (ground).

The present invention contemplates that the gate electrodes of the FeGFETs in the illustrative memory array of FIG. 9A may be connected to either a corresponding write bit line 120, 124 (as shown) or a corresponding read/write bit line 122, 126, and that one or more connections of the gate electrodes of the memory cells may alternatively be connected to one or the other bit lines in order to provide desired electrical behavior, such as, for example, a balanced bit line capacitance.

Figure 9E:
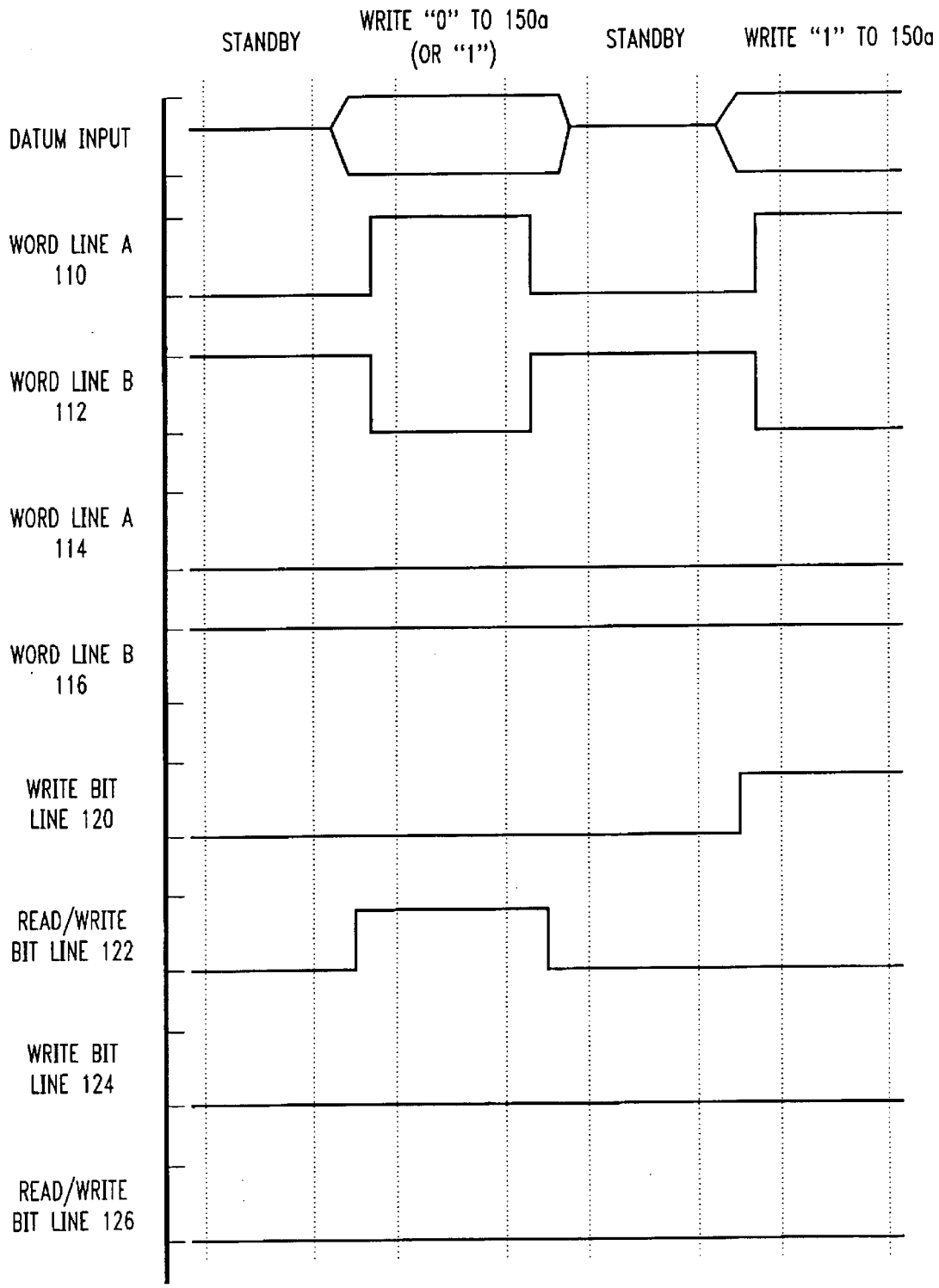
FIG. 9E is a logical timing diagram depicting preferred signals for writing a selected memory cell within the memory array shown in FIG. 9A.

FIG. 9E is an illustrative timing diagram depicting preferred signals for writing the contents of a selected memory cell 150a within the memory array 170, in accordance with the present invention. These signals cause memory cell 150a to successively transition from a standby mode, to a write "0" mode, back to a standby mode, and then to a write "1" mode. As previously described, in this example, word lines 114 and 116 correspond to unselected memory cells and therefore word line 114 is held low and word line 116 is held high, thereby maintaining a standby mode for memory cells 150b and 150d. Similarly, bit lines 124 and 126 correspond to unselected memory cells and therefore write bit line 124 and read/write bit line 126 are held low.

Figure 10A:
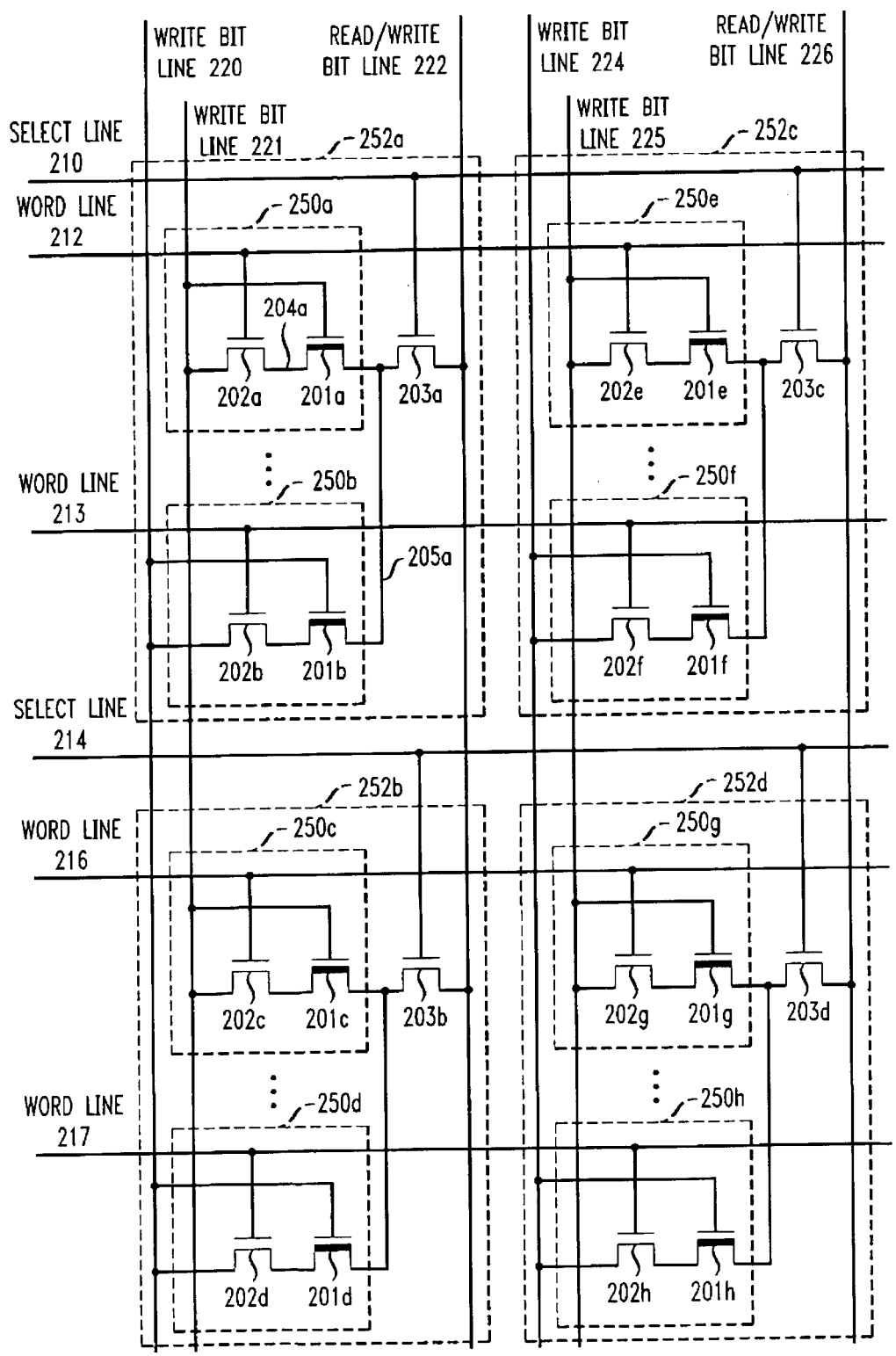
FIG. 10A is a schematic diagram illustrating at least a portion of an exemplary non-volatile memory array including a plurality of single FET/single FeGFET memory cells coupled to corresponding select FETs, formed in accordance with another aspect of the invention.

FIG. 10A illustrates at least a portion of an alternative embodiment of the non-volatile memory array shown in FIG. 9A, formed in accordance with another aspect of the present invention. As shown in FIG. 10A, the alternative memory array 270 includes a plurality of memory cells 250a, 250b, 250c, 250d, 250e, 250f, 250g and 250h. The memory cells are preferably arranged into one or more groups 252a, 252b, 252c and 252d, such that each group includes at least one memory cell. The memory array 270 further includes a plurality of select FETs 203a, 203b, 203c and 203d, each select FET being associated with a different group 252a, 252b, 252c, 252d, respectively, for selectively accessing a desired group in response to a control signal presented to a gate terminal of the corresponding select FET.

Each of the memory cells in the memory array 270 preferably comprises a FeGFET device, which may be formed in a manner consistent with the FeGFET device previously described, and a FET device connected in series with the FeGFET. For example, a given memory cell, exemplified by memory cell 250a, includes FET 202a and FeGFET 201a connected such that a first drain/source terminal of FET 202a is connected to a first drain/source terminal of FeGFET 201a at node 204a. A gate terminal of the FeGFET 201a in the memory cell 250a is preferably connected to a second drain/source terminal of the FET 202a. The single FET/single FeGFET memory cell architecture of FIG. 10A is advantageous, compared to the dual FET/single FeGFET memory cell architecture of FIG. 9A, primarily since it eliminates a FET from each memory cell, thereby providing a more dense memory array.

The memory array 270 preferably includes a plurality of word lines 212, 213, 216 and 217, select lines 210 and 214, and bit lines (including write bit lines and read/write bit lines) 220, 221, 222, 224, 225, 226, operatively coupled to corresponding memory cells in the memory array. It is to be appreciated that, although not shown, a complete memory circuit is preferably formed by connecting the word lines 212, 213, 216, 217, select lines 210, 214 and bit lines 220, 221, 222, 224, 225, 226 of the memory array 270 to respective word line drivers, select line drivers (e.g., which may be formed in a manner consistent with the word line drivers) and bit line drivers/multiplexors that may further connect to other peripheral circuits, such as, for example, decoders, write circuits, read circuits (e.g., sense amplifiers), etc., as will be understood by those skilled in the art. These additional peripheral circuits may be used, at least in part, to selectively control the memory array for reading and/or writing the logic state of one or more memory cells in the array.

The select lines 210, 214 are preferably coupled to the gate terminals of corresponding select FETs, 203a, 203b, 203c, 203d, which, as previously explained, are used to access one or more groups 252a, 252b, 252c, 252d of memory cells along a word (i.e., horizontal) dimension, although alternative selection circuitry may be similarly employed. Select line 210 is preferably coupled to select FETs 203a and 203c and is used to access groups 252a and 252c, respectively. Likewise, select line 214 is preferably coupled to select FETs 203b and 203d and is used to access groups 252b and 252d, respectively.

Each of the select FETs (e.g., n-type FET) associated with a given group of memory cells preferably functions as a pass gate and may, in fact, be implemented using alternative switching circuitry, such as, for example, a multiplexor. When enabled (e.g., by a logic high signal on a corresponding select line), each select FET is preferably configured so as to provide an electrical connection between a common junction of all second drain/source terminals of the FeGFET devices corresponding to the given group and a read/write bit line coupled to one or more groups in a bit (i.e., vertical) dimension. It is to be understood that alternative circuits may be employed for providing such electrical connection. For the representative group 252a, select FET 203a includes a first drain/source terminal which is coupled to the second drain/source terminals of FeGFETs 201a and 201b associated with memory cells 250a and 250b, respectively, at node 205a. A second drain/source terminal of select FET 203a is connected to read/write bit line 222, which is also coupled to select FET 203b associated with group 252b in a similar manner.

The FET in each memory cell is preferably connected such that its second drain/source terminal is coupled to a corresponding write bit line and a gate terminal of the FET is coupled to a corresponding word line. There is preferably a separate write bit line for each memory cell in a given group, such that no two memory cells in the same group are coupled to the same write bit line. Furthermore, there is preferably a separate word line for each memory cell in a given group, such that no two memory cells in the group share the same word line. For instance, with regard to group 252a, FET 202a in memory cell 250a has its second drain/source terminal connected to write bit line 221 and FET 202b in memory cell 250b has its second drain/source terminal connected to write bit line 220. Likewise, the gate terminal of FET 202a is connected to word line 212 and the gate terminal of FET 202b is connected to word line 213.

By way of example only, a read operation directed to a selected memory cell 250a in the illustrative memory array 270 will now be explained. In the following discussion, it will be assumed that all memory cells, including selected memory cell 250a, begin in a standby mode of operation. The standby mode of the single FET/single FeGFET memory cells may be similar to the standby mode described above in connection with the dual FET/single FeGFET memory architecture shown in FIG. 9A. For example, a logic low (i.e., "0") on the select lines 210, 214 and a logic high (i.e., "1") on the word lines 212, 213, 216, 217 preferably places the memory cells into standby mode. With regard to memory cell 250a, in standby mode, FET 202a becomes active, thereby shunting the first drain/source terminal of FeGFET 201a to write bit line 221, which electrically connects the drain/source terminal of the FeGFET 201a at node 204a to its gate terminal. Similarly, the logic "0" on select line 210 disables select FET 203a, thereby electrically disconnecting (i.e., open circuiting) the second drain/source terminal of FeGFET 201a at node 205a from read/write bit line 222. The first drain/source terminal of FeGFET 201a charges the second drain/source terminal of FeGFET 201a through the conducting channel of FeGFET 201a. Hence, in standby mode, all three terminals of FeGFET 201a will charge to the same potential, namely, that of write bit line 221. With the absence of a field across the terminals of FeGFET 201a, the electric dipole state of FeGFET 201a (i.e., its logic state) is maintained.

It is important to consider all memory cells (e.g., memory cells 250a, 250b) within a particular group (e.g., group 252a). For example, in order to minimize power consumption in the memory array it is preferable to keep the write bit lines 220, 221 of the memory cells within a given group 252a, that are currently in standby mode, at the same potential since the FeGFETs 201a, 201b associated with these memory cells 250a, 250b, respectively, have their second drain/source terminals connected to one another at node 205a and can therefore form a series conduction path from one write bit line 221 to the other write bit line 220 through the FeGFET devices 201a, 201b.

Reading the single FET/single FeGFET memory cells may be performed in a manner consistent with the read mode of the dual FET/single FeGFET memory cell architecture previously described in conjunction with FIG. 9A, one exception being the inclusion of the select FETs (e.g., 203a) shared by a plurality of memory cells (e.g., 250a, 250b) corresponding to a particular group (e.g., 252a). To read the contents from one of the memory cells 250a or 250b corresponding to a selected group 252a, the select FET 203a associated with that group 252a must be enabled, for example, by driving select line 210 to a logic "1." Additionally, one FET, either 202a or 202b, in one of the memory cells 250a, 250b, respectively, in group 252a must be enabled, for example, by driving either word line 212 or word line 213 to a logic "1." A conduction path between read/write bit line 222 and write bit line 221 or write bit line 220 is thus formed that includes either the channel resistance of FeGFET 201a of memory cell 250a or the channel resistance of FeGFET 201b of memory cell 250b, respectively.

Memory cells other than the selected memory cell 250a along a given selected word line may be referred to herein as "half-selected" cells. In the above example, since word line 212 is active (logic "1"), memory cell 250e is considered half-selected. Half-selected memory cells are not disturbed (i.e., contents altered) by a read or write operation directed to the selected memory cell(s). It should be noted that independence of memory cells connected to the selected bit line is demonstrated by showing that essentially all memory cells other than the selected memory cell 250a are held in a standby mode, and thus are not disturbed by a read or write operation directed to a selected memory cell. It is also contemplated that more than one memory cell can be accessed along a selected word line, as is typically done in conventional solid state memories (e.g., static random access memory (SRAM)).

Figure 10B:
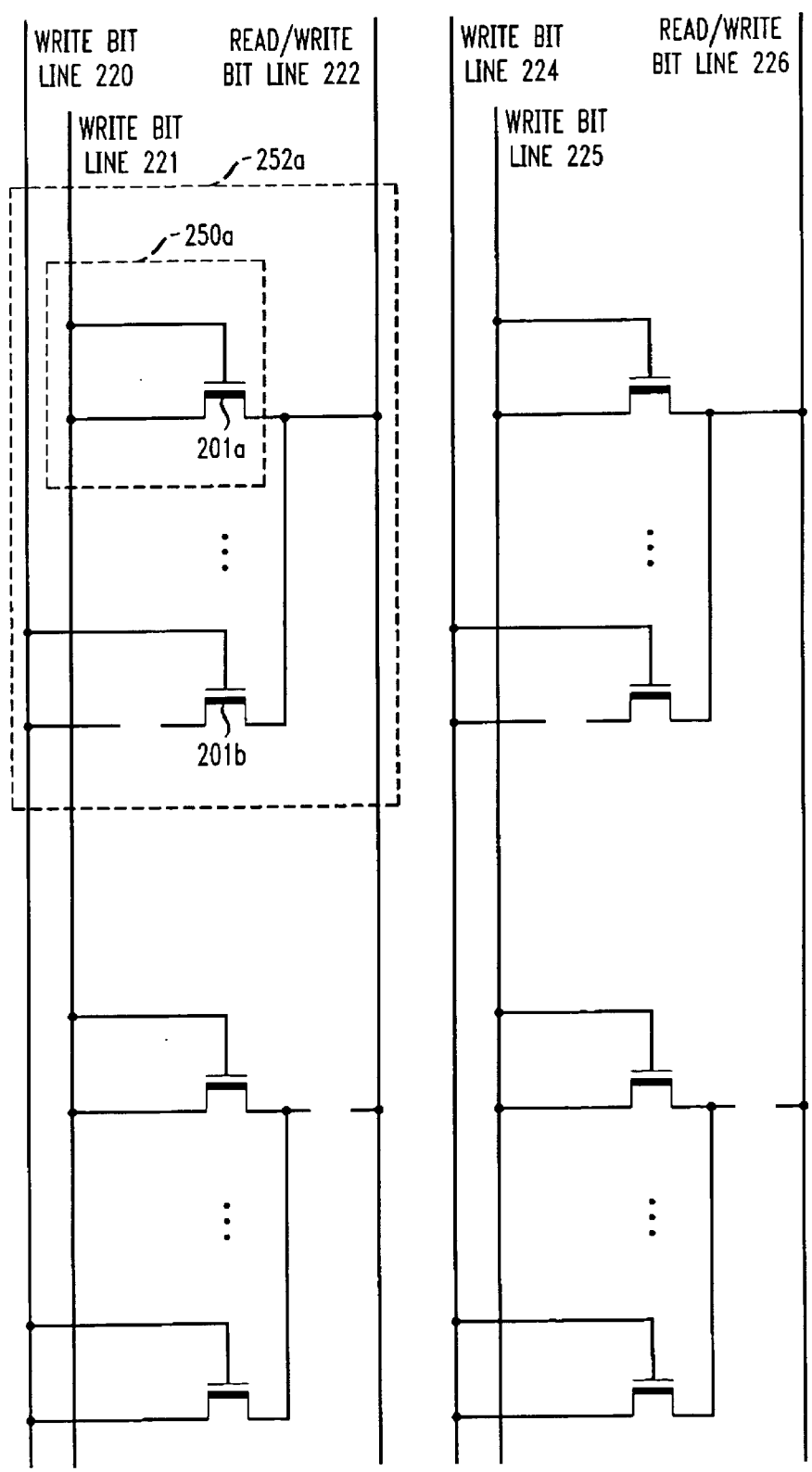
FIG. 10B is a schematic diagram illustrating is functional circuit arrangement of the memory array shown in FIG. 10A, configured for a read operation.

FIG. 10B illustrates the exemplary memory array 270 configured in the manner previously described, namely, with selected memory cell 250a in a read mode of operation. This figure is essentially the same as FIG. 10A, with the exception that all FETs 202a through 202h and 203a through 203d have been removed for ease of explanation and replaced by their functional equivalent circuits, namely, either a short circuit, corresponding to an active FET (e.g., FETs 202a, 202c, 202d, 202e, 202g, 202h, 203a and 203c), or an open circuit, corresponding to an inactive FET (e.g., FETs 202b, 202f, 203b and 203d). The read operation is substantially the same as that previously explained in conjunction with the memory array depicted in FIG. 9B, only write bit line 221 is preferably grounded and read/write bit line 222 is connected to an input of a sense amplifier.

Figure 10C:
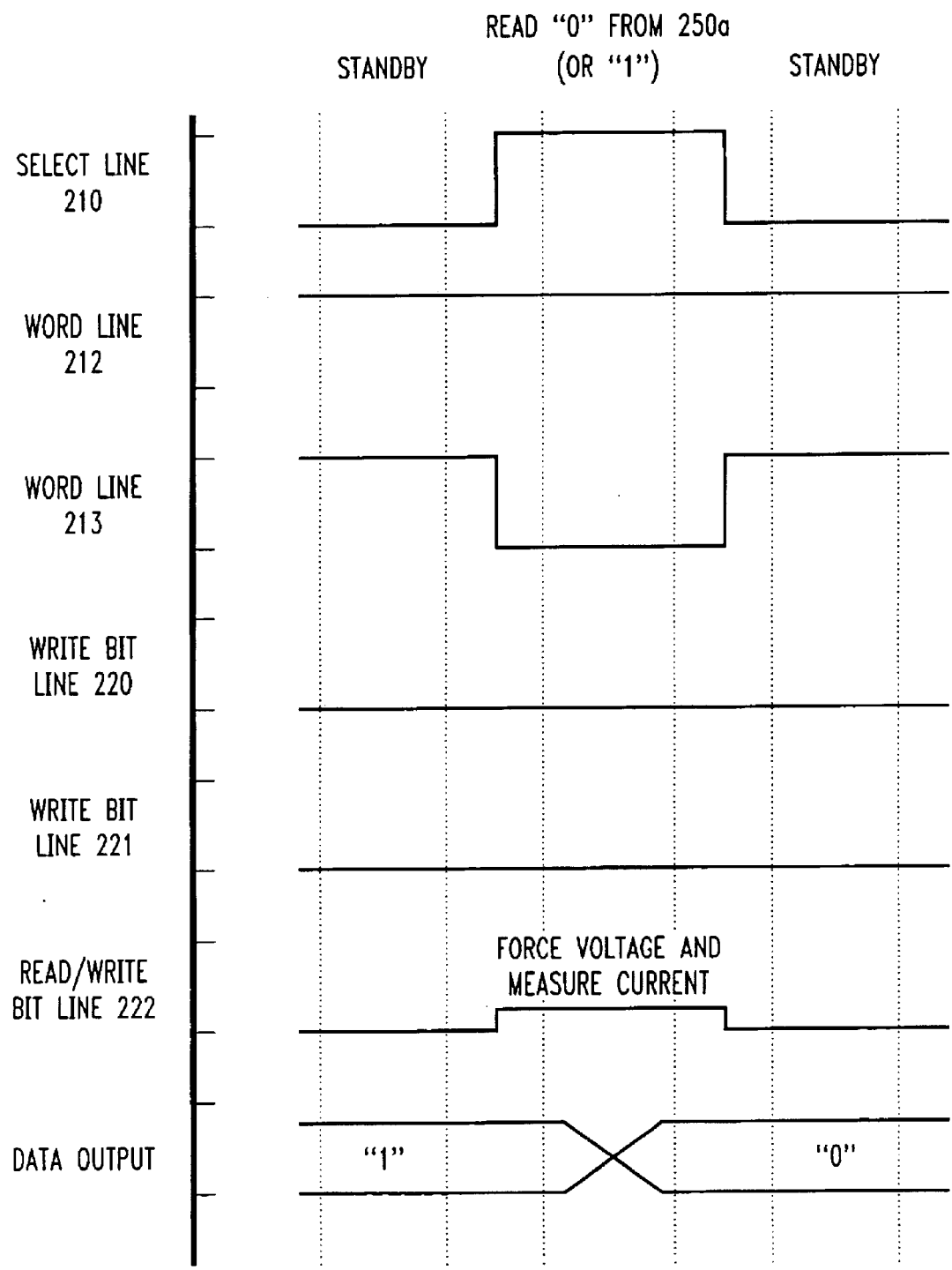
FIGS. 10C and 10D are logical timing diagrams depicting preferred signals for reading a selected memory cell within the memory array shown in FIG. 10A.
Figure 10D:
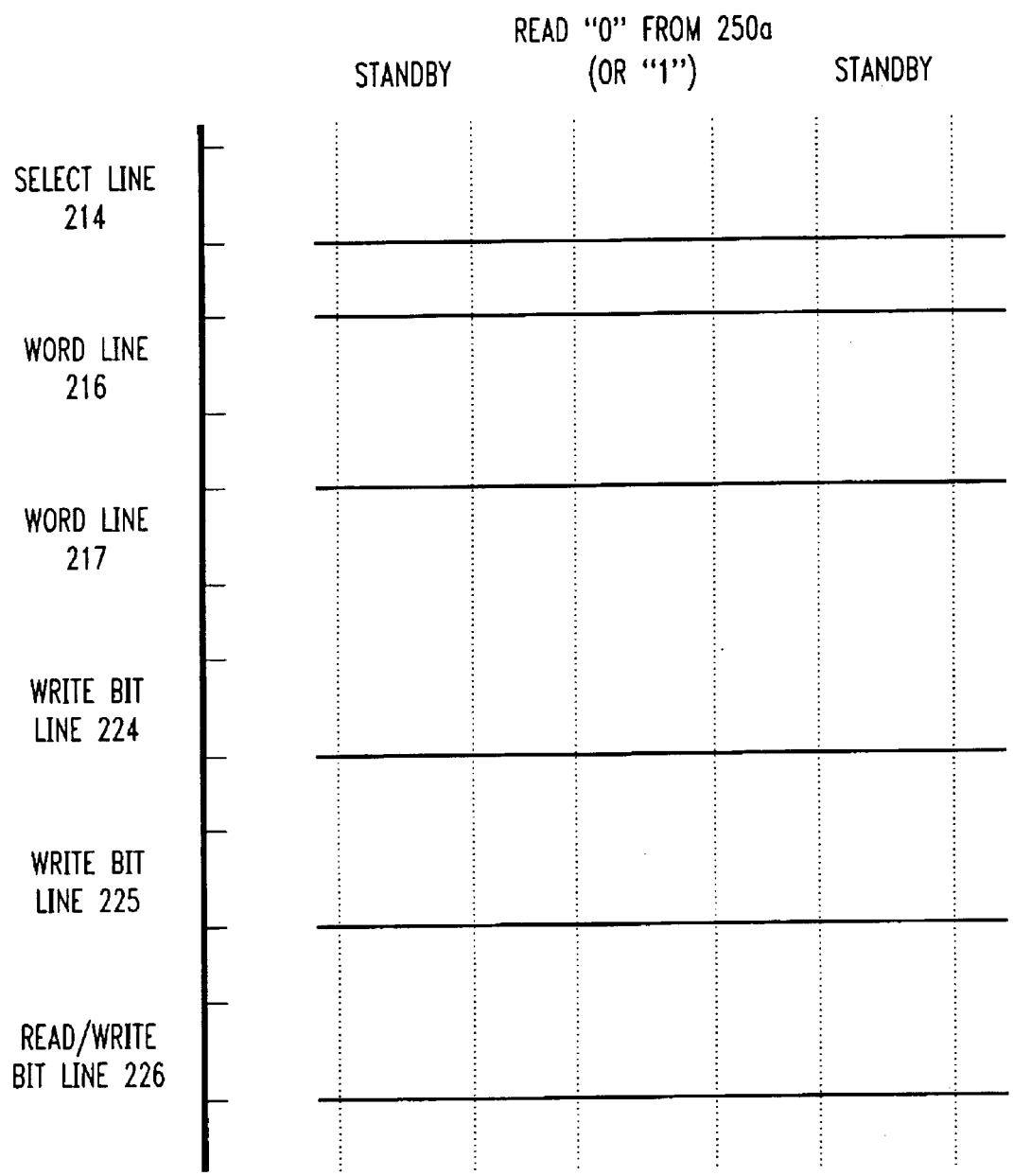

FIGS. 10C and 10D are illustrative timing diagrams depicting preferred signals for reading the contents of a selected memory cell 250a within the memory array 270, in accordance with the present invention. These signals cause memory cell 250a to transition from a standby mode, to a read mode, and then back to a standby mode. Initially, all memory cells are preferably in the standby mode, and therefore select lines 210 and 214 are at a logic "0." Since groups 252b and 252d do not include the selected memory cell, select line 214 remains at a logic "0" throughout the read operation. For standby mode operation, the FET in each memory cell is preferably active, and therefore word lines 212, 213, 216 and 217 are at a logic "1" as shown. Word lines 216 and 217 correspond to unselected memory cells and are thus held at a logic "1," thereby maintaining a standby mode for memory cells 250c, 250d, 250g and 250h throughout the read operation. The potentials of write bit lines 220, 221, 224 and 225 are preferably only changed during a write operation, and are therefore held at a logic "0" during the read operation and during standby mode. Additionally, since a read operation is not being performed on memory cells associated with groups 252c and 252d, read/write bit line 226 is held at logic "0."

When reading selected memory cell 250a, select line 210 corresponding to the selected memory cell transitions from a "0" to a "1," thereby activating the select FET 203a corresponding to the group 252a associated with the selected memory cell 250a. During the read operation, the contents of unselected memory cell 250b residing in the same group 252a as the selected memory cell 250a would also be accessed. In order to prevent this, word line 213 is driven to a logic "0" during the read operation and then brought back to a logic "1" again when in standby mode. In this manner, the FET 202b associated with the unselected memory cell 250b is disabled during the read operation, thereby preventing the contents of memory cell 250b from being read on read/write bit line 222. The contents of memory cell 250a may be read by forcing a voltage on read/write bit line 222 and concurrently measuring a current, or vice versa, as understood by those skilled in the art.

Referring again to FIG. 10A, a write operation directed to memory cell 250a, referred to herein as the selected memory cell, will be described. It will be assumed that all memory cells, including selected memory cell 250a, are initially in the standby mode of operation. Writing a selected memory cell within a selected group of memory cells involves propagating a pair of half-state voltages to the selected memory cell, wherein the half-state voltages are combined into a full-state voltage having sufficient magnitude to write the dipole of the FeGFET device within the selected memory cell to a new state. Unselected memory cells within the memory array retain their prior states.

Figure 10E:
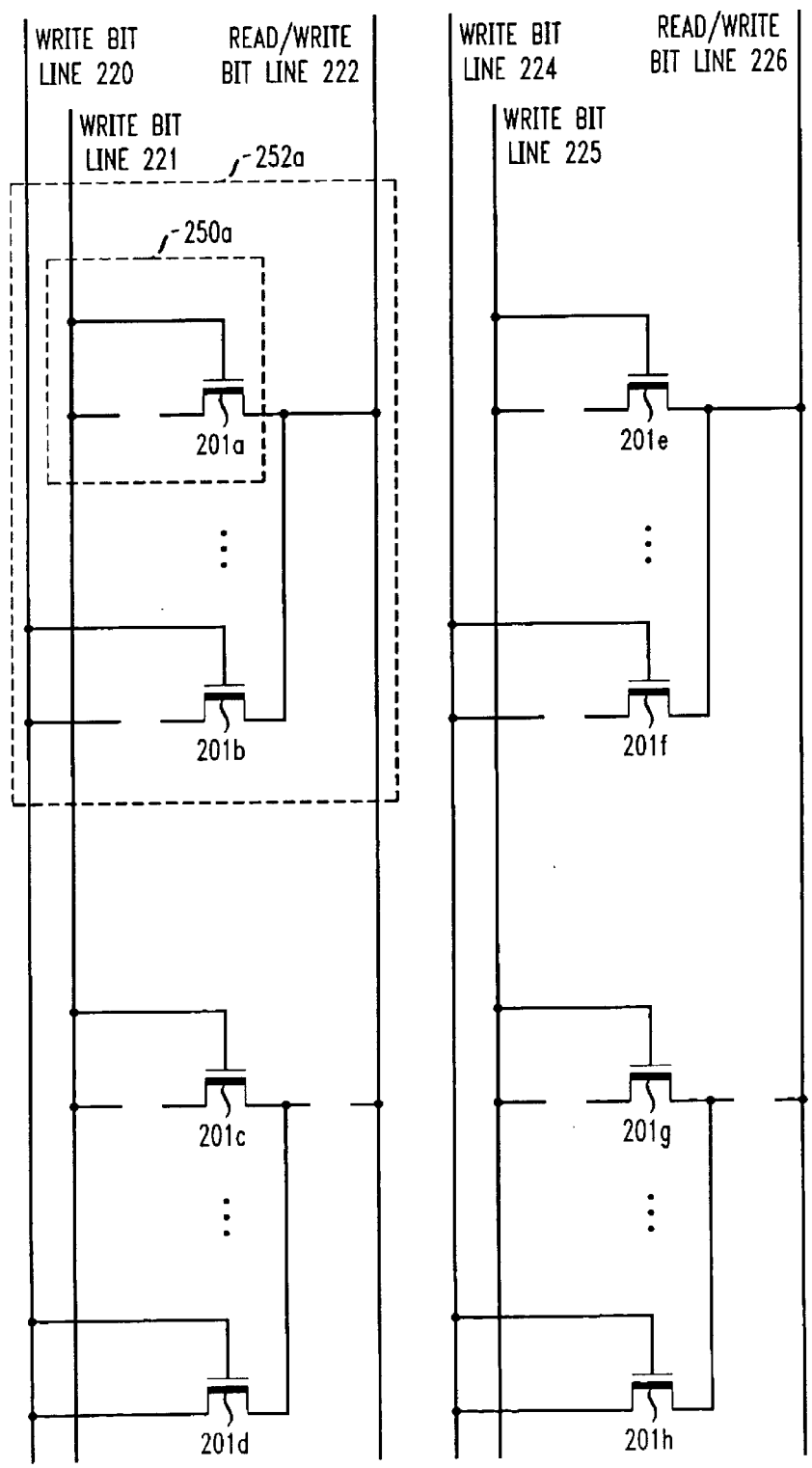
FIG. 10E is a schematic diagram illustrating is functional circuit arrangement of the memory array shown in FIG. 10A, configured for a write operation.

In a write operation directed to memory cell 250a, signals propagated along the word lines and select lines selectively cause the drain and source nodes of the FETs 202a–202h and 203a–203d to either open-circuit or short-circuit. Specifically, a logic "1" on select line 210 shunts shared nodes 205a and 205c to read/write bit lines 222 and 226, respectively, through corresponding select FETs 203a and 203c. Similarly, a logic "0" on select line 214 open-circuits shared nodes 205b and 205d from connection with read/write bit lines 222 and 226, respectively. A logic "0" on word line 212 opens memory cell node 204a from connection with corresponding write bit line 221, leaving the drain/source terminals of FeGFET 201a connected together intrinsically via the channel of FeGFET 201a. The same holds true for FeGFET 201e. Likewise, a logic "0" on word lines 213 and 216 open-circuits the respective FETs connected thereto, leaving the drain/source terminals of the corresponding FeGFETs 201b, 201c, 201f, 201g connected together intrinsically through their respective channels. A logic "1" on word line 217 shunts the drain/source terminals of FeGFETs 201d and 201h to write bit lines 220 and 224, respectively, through corresponding FETs 202d and 202h. FIG. 10E is a schematic diagram illustrating the functional connection of FeGFETs within the memory array 270 configured as described above.

With reference to FIG. 10E, write signals propagated along the bit dimension will be discussed. As previously explained, writing selected memory cell 250a comprises propagating pairs of half-state voltages along write bit line 221 and read/write bit line 222 to memory cell 250a. The half-state voltages conveyed by each bit line 221, 222 converge on FeGFET 201a and combine, resulting in the formation of either a positive or negative full-state voltage across the ferroelectric insulator associated with FeGFET 201a (from gate to channel). The full-state voltage is preferably large enough to write the dipole of FeGFET 201a to a logical "1" or "0" state, respectively, whereas the half-state voltages applied across other memory cells (e.g., 250b), are preferably small enough to leave the logic state of the FeGFETs (e.g., 201b) associated with these other cells substantially undisturbed.

In practice, in order to write a given FeGFET 201a to a logical "1," the gate of the FeGFET 201a is preferably shunted to ground (i.e., a logic "0") through a corresponding write bit line 221 while drain/source and drain/source terminals of the FeGFET 201a are shunted to VDD (i.e., a logic "1") through a corresponding read/write bit line 222. Alternatively, to write FeGFET 201a to a logic "0," the gate of FeGFET 201a is shunted to VDD while the drain/source and drain/source terminals of FeGFET 201a are shunted to ground. The gate potentials of the other memory cells (e.g., 250b) within the selected group 252a (which are considered half-selected cells) are preferably shunted, through their respective write bit lines 220, 221, to an intermediate potential halfway between ground and VDD (e.g., VDD/2), and consequently, only half-state voltages, one half the full supply voltage, are dropped across their ferroelectric insulators, from their respective gates to their channel regions. Whether they are positive or negative in sign, the resulting half-state voltages across these half-selected memory cells are preferably designed to be below the coercive voltage (defined as the minimum voltage necessary to change, write, and/or switch the dipole state) of the FeGFETs, and thus the respective states of the unselected memory cells remain unchanged (i.e., undisturbed). Accordingly, a new state can be written to a selected FeGFET (e.g., FeGFET 201a) without undesirably changing the state of an unselected FeGFET (e.g., FeGFET 201b) residing within the same group (e.g., 252a).

Figure 10F:
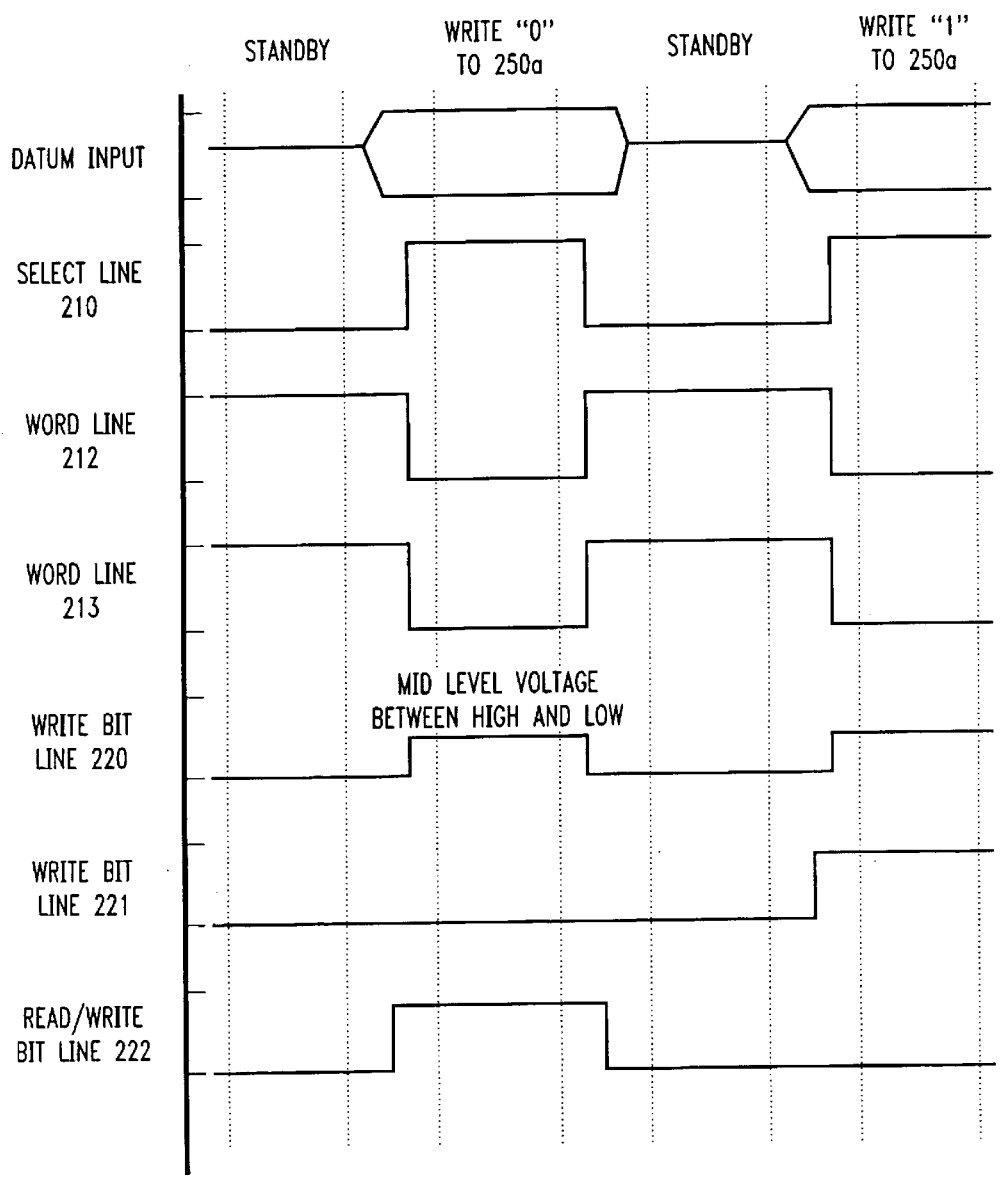
FIGS. 10F and 10G are logical timing diagrams depicting preferred signals for writing a selected memory cell within the memory array shown in FIG. 10A.
Figure 10G:
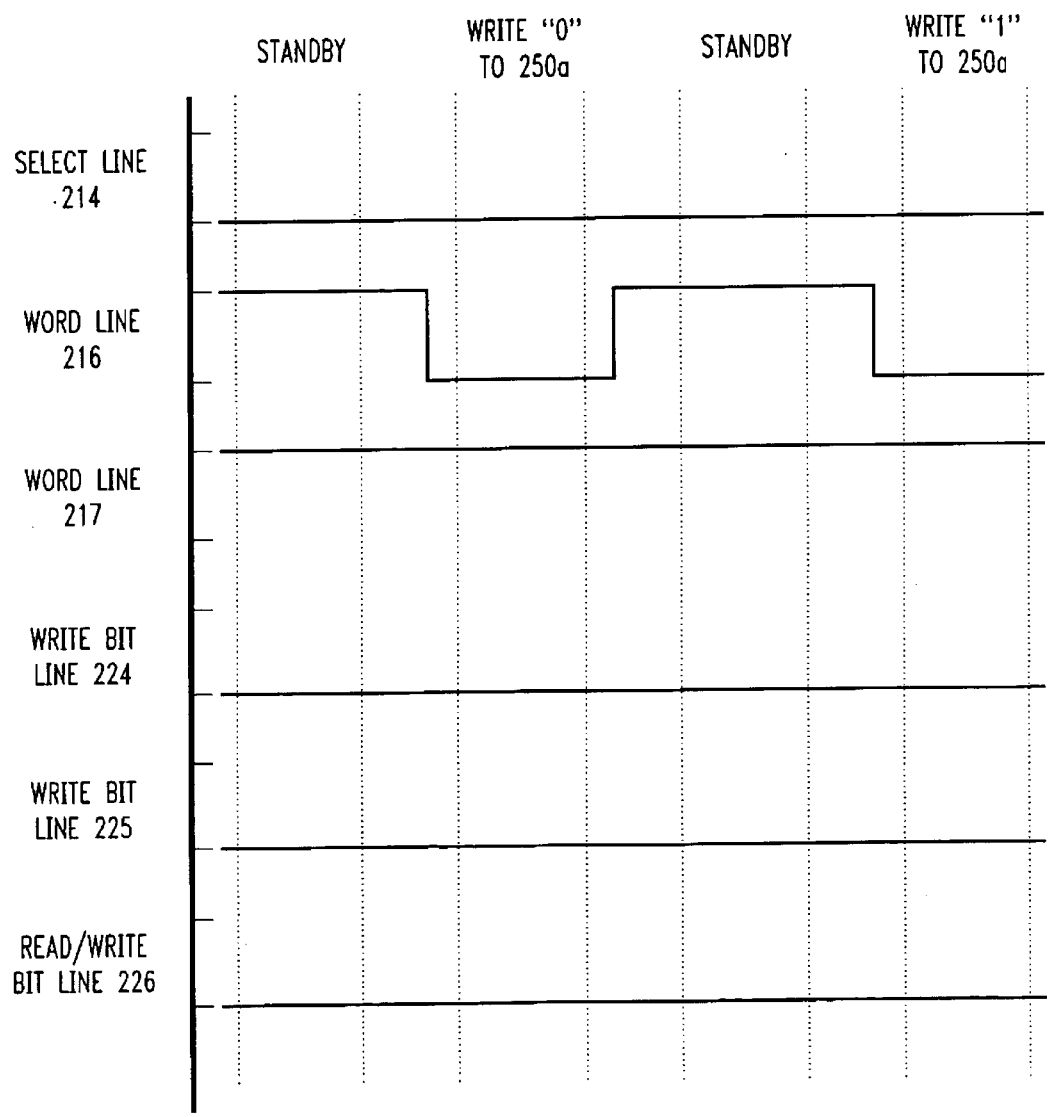

By way of example only, FIGS. 10F and 10G are illustrative timing diagrams depicting signals for writing the contents of a selected memory cell 250a within the memory array 270, in accordance with the present invention. Appropriate signals on word lines 212, 213, 216, 217, select lines 210, 214, and bit lines 220, 221, 222, 224, 225, 226 preferably cause the selected memory cell 250a to transition from a standby mode, to a write "0" mode, to a standby mode, and finally to a write "1" mode, as shown.

Figure 11A:
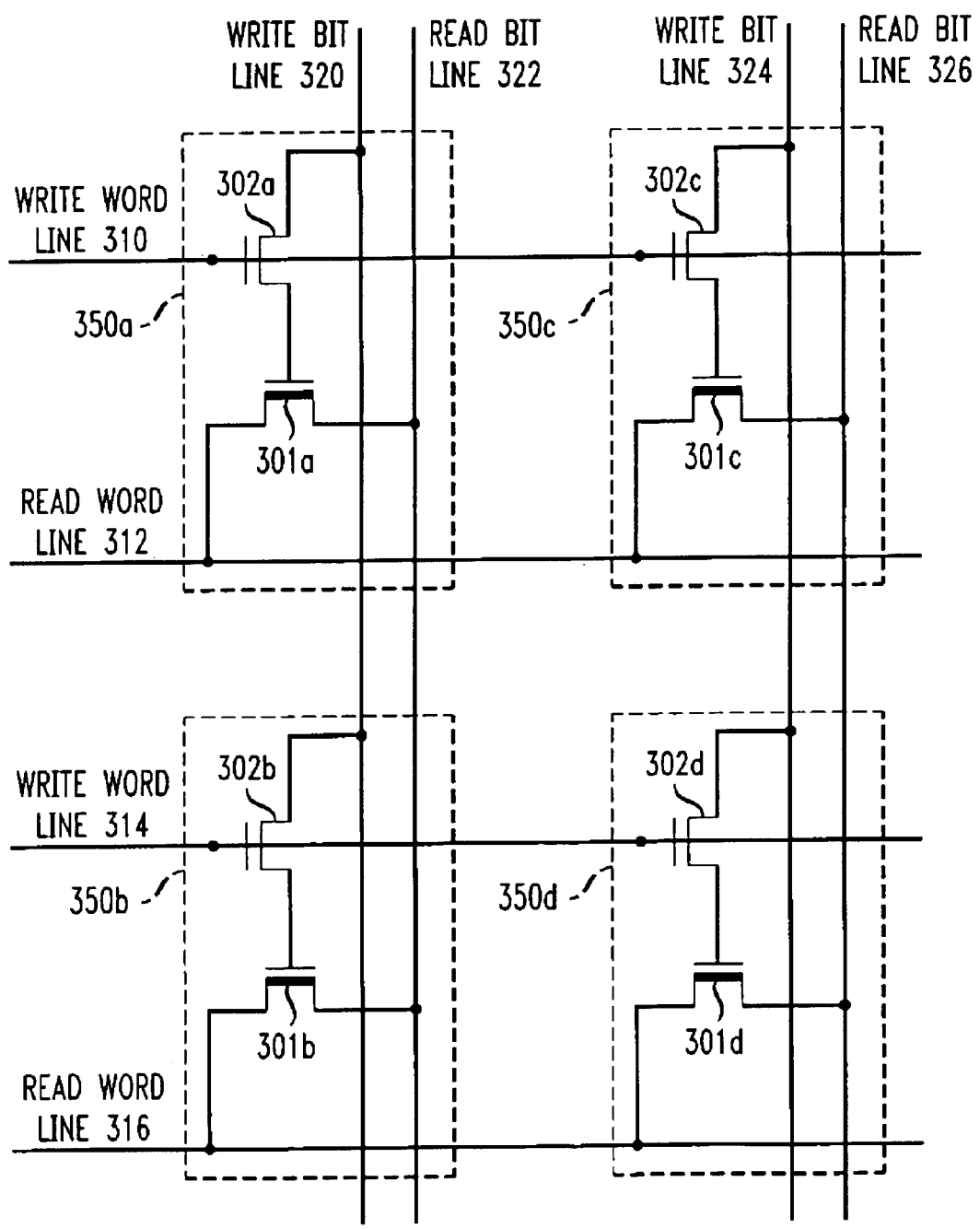
FIG. 11A is a schematic diagram illustrating at least a portion of an exemplary non-volatile memory array including a plurality of single FET/single FeGFET memory cells, formed in accordance with another embodiment of the present invention.

With reference now to FIG. 11A, there is shown an exemplary non-volatile memory array 370 comprising a plurality of single FET/single FeGFET memory cells 350a, 350b, 350c and 350d, formed in accordance with another aspect of the present invention. Each of the memory cells 350a, 350b, 350c, 350d in the illustrative memory array 370 comprises a FET 302a, 302b, 302c, 302d and a corresponding FeGFET 301a, 301b, 301c, 301d, respectively, associated therewith. The memory array 370 further comprises a plurality of write word lines 310, 314, a plurality of read word lines 312, 316, a plurality of write bit lines 320, 324, and a plurality of read bit lines 322, 326 operatively coupled to corresponding memory cells for selectively reading and writing individual memory cells in the array. As in the case of the memory arrays previously discussed, a complete memory circuit may be formed by connecting the word lines 310, 312, 314, 316 and bit lines 320, 322, 324, 326 of memory array 370 to peripheral circuitry (not shown), including, for example, word drivers, bit drivers/multiplexors, write circuits (e.g., decoders), read circuits (e.g., sense amplifiers), etc.

In each of the memory cells, the FET is operatively coupled to the corresponding FeGFET device, as will be described in further detail below. In a manner consistent with the other memory architectures of the present invention described above, the FeGFET in each memory cell is used primarily as a non-volatile storage element for storing the logical state of the associated cell. The FET in each memory cell is preferably employed to provide selective access to the FeGFET during a write operation. As apparent from the figure, the memory cells 350a, 350b, 350c and 350c in memory array 370 are configured in an alternative arrangement, as compared to the memory cells depicted in FIG. 10A. An important benefit of this alternative configuration is that it eliminates the need for select FETs, thus advantageously providing a more dense memory architecture.

The FET in each of the memory cells is preferably configured so that its first drain/source terminal is coupled to a corresponding write bit line, its second drain/source terminal is coupled to the gate terminal of the corresponding FeGFET, and its gate terminal is coupled to a corresponding write word line. The FeGFET in each memory cell is preferably configured so that a first drain/source terminal is coupled to a corresponding read bit line and a second drain/source terminal is coupled to a corresponding read word line. As previously explained, the drain and source terminals of each of the FETs and FeGFETs are essentially bi-directional, and therefore these terminals will be referred to herein as simply first and second drain/source terminals.

Each of the memory cells 350a through 350d is preferably disposed at an intersection between a pair of corresponding word lines, namely, a write word line 310, 314 and a read word line 312, 316, and a pair of corresponding bit lines, namely, a write bit line 320, 324 and a read bit line 322, 326. The word lines and bit lines are arranged substantially orthogonal to one another, although alternative arrangements are contemplated by the present invention. Write operations to the memory cells are primarily actuated by appropriate signals conveyed along write word lines 310, 314 and write bit lines 320, 324, respectively. Likewise, read operations from the memory cells are primarily enabled through read word lines 312, 316 and read bit lines 322, 326, respectively.

A more detailed description of the memory cell follows, with specific reference to a representative memory cell 350a. Memory cell 350a comprises a FET 302a and a FeGFET 301a, connected together as previously described. Specifically, the gate terminal of FET 302a is preferably connected to write word line 310, the first drain/source terminal of FET 302a is connected to write bit line 320, and the second drain/source terminal of FET 302a is connected to the gate terminal of FeGFET 301a. The first drain/source terminal of FeGFET 301a is preferably connected to read word line 312, and the second drain/source terminal of FeGFET 301a is connected to read bit line 322. It will be assumed that the FETs used in the memory cells are n-type FETs, and thus are activated by a logic high signal presented to their respective gate terminals.

Preferably, each of the memory cells in illustrative memory array 370 is operational in at least a standby mode, a read mode, and a write mode. The memory cells preferably remain in a standby mode until a read or write operation is requested, and subsequently return to the standby mode once the read or write operation has ended. As previously stated, in a standby mode of operation, the state of the memory cell, which is stored within the FeGFET device, is protected (i.e., maintained). While in the standby mode, all word lines 312, 316 and bit lines 320, 322, 324, 326 in the memory array 370, except write word lines 310, 314 which are preferably grounded, are kept at an equipotential voltage $V_{eq}$, thus essentially connecting the first and second drain/source terminals of each of the FeGFETs to the common voltage potential Veq.

The equipotential voltage $V_{eq}$ may be essentially any voltage between the negative and positive voltage supply rails of the memory array, and is preferably about half the supply voltage (e.g., VDD/2). By forcing all word and bit lines to be at the same voltage, no driving potential exists in the memory array 370, and therefore the respective states of the electric dipoles associated with FeGFETs 301a through 301d remain intact. Since the dipole orientation of each FeGFET device defines the logical (i.e., Boolean) state of the corresponding memory cell, the memory state of a given memory cell in the standby mode is unchanged. Moreover, since no current flows while the word and bit lines are at the equipotential voltage, no power is consumed in the memory array.

In the previously noted exception, wherein write word lines 310, 314 are grounded rather than kept at the equipotential voltage, the FETs 302a through 302d are all disabled. Therefore, even if one of the write word lines 310 or 314 were driven to a logic high state (e.g., in an alternative standby mode configuration), thereby activating two or more of the FETs connected to the particular word line, a driving potential would still not exist in the memory array 370 and thus power would not be consumed. Alterative standby mode configurations, such as, for example, forcing all array nodes to ground, are similarly contemplated, e.g., for minimizing power consumption in the peripheral circuits.

Figure 11B:
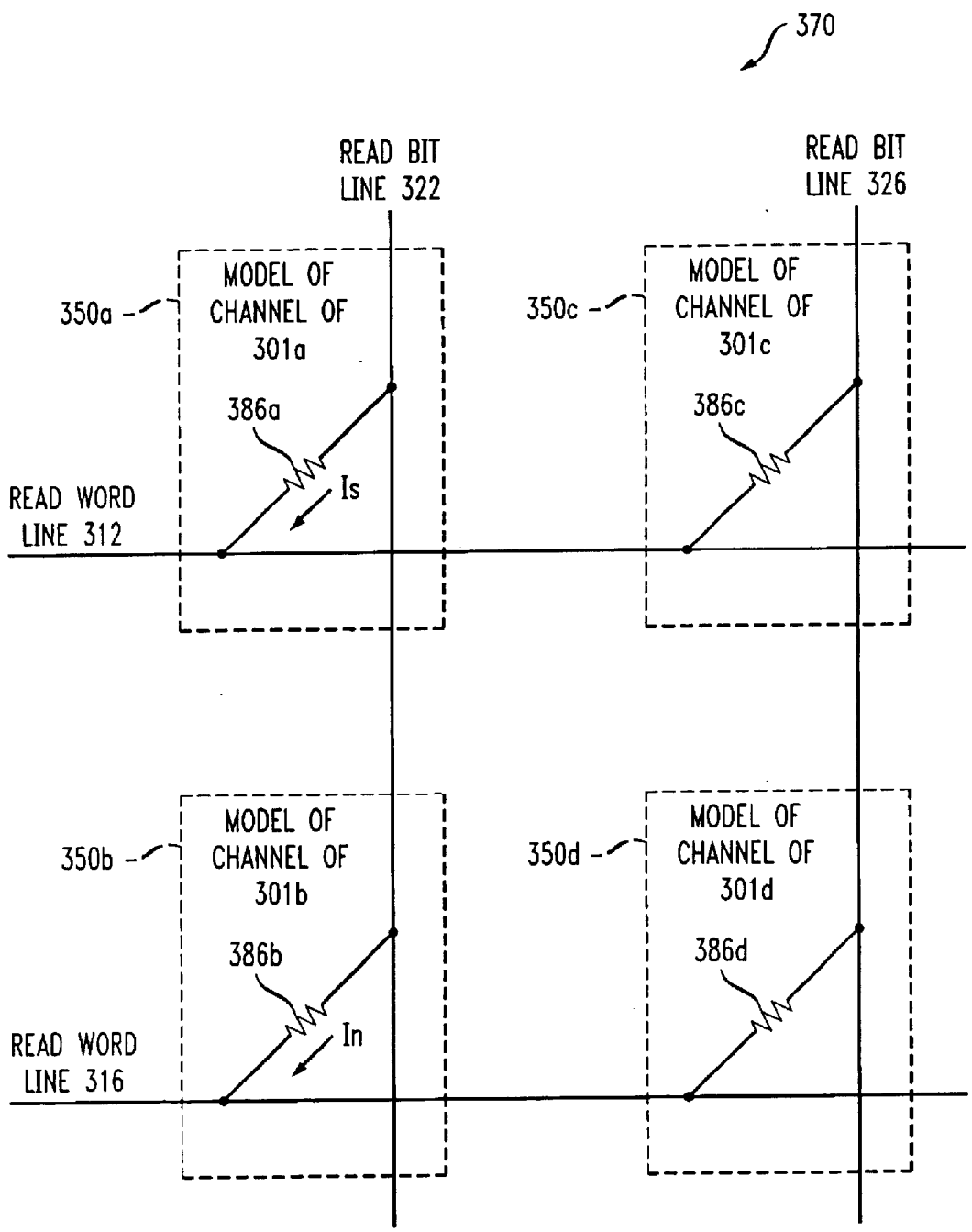
FIG. 11B is a schematic diagram illustrating is functional circuit arrangement of the memory array shown in FIG. 11A, configured for a read operation.

By way of example only, a read operation directed to a selected memory cell 350a in the illustrative memory array 370 will now be described. In the following discussion, it will be assumed that all memory cells, including selected memory cell 350a, are initially in a standby mode of operation, as previously explained. During a read operation, the write word lines 310, 314 are preferably held at a logic "0," thereby disabling the FETs and open-circuiting the gate terminals of the FeGFETs in each of the memory cells in the memory array. FIG. 11B depicts a simplified schematic diagram of the memory array 370 configured for a read operation of memory cell 350a. Specifically, the FETs associated with the memory cells 350a through 350d have been removed and FeGFETs 301a, 301b, 301c, 301d are shown with corresponding channels modeled as resistors 386a, 386b, 386c, 386d, respectively. The value of each of these resistors 386a through 386d changes in accordance with the logical state of the FeGFET associated therewith, which represents one of two possible electric dipole orientations of the FeGFET, as previously explained.

Figure 11C:
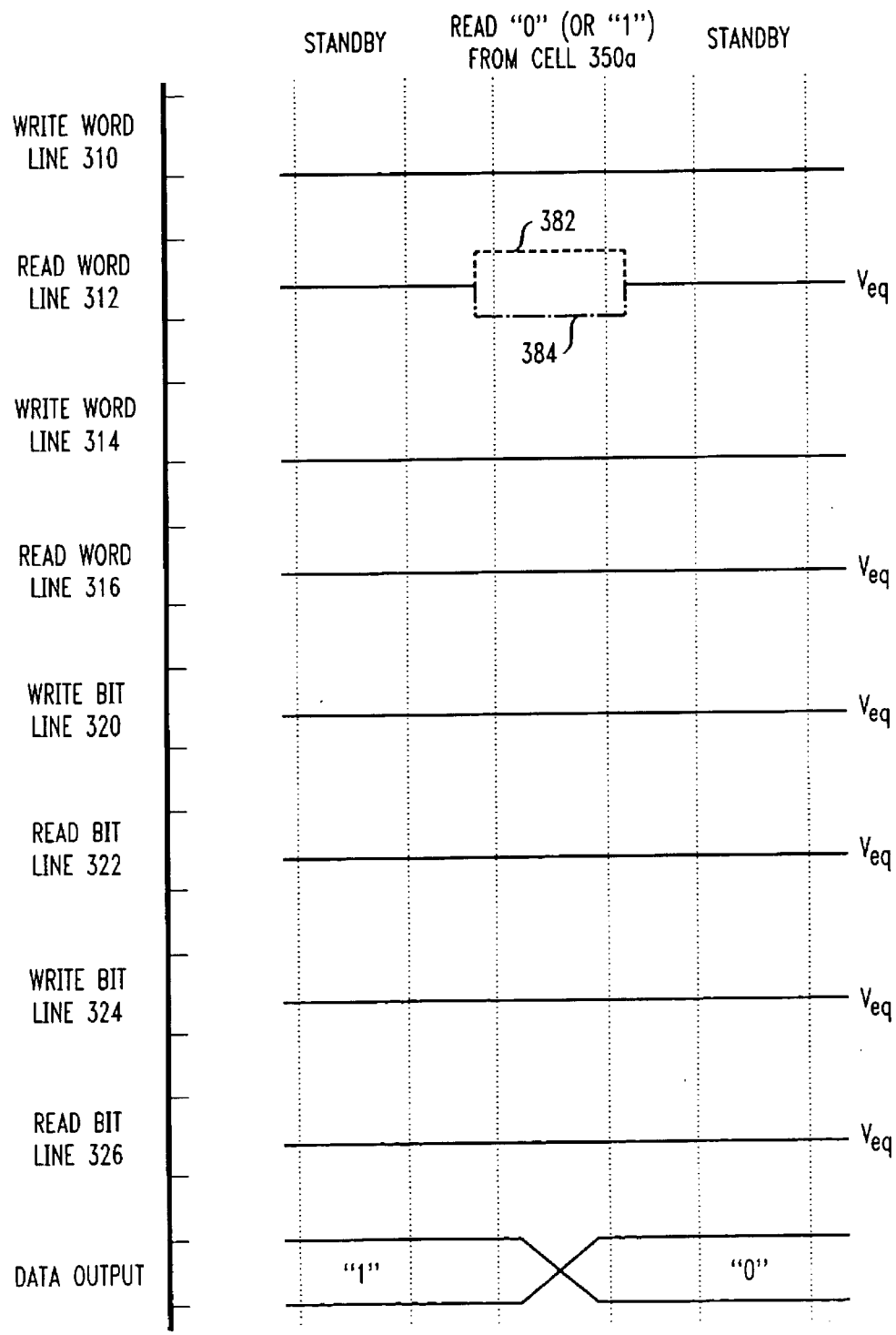
FIG. 11C is a logical timing diagram depicting preferred signals for reading a selected memory cell within the memory array shown in FIG. 11A.

FIG. 11C illustrates an exemplary timing diagram for reading a selected memory cell 350a in the memory array 370, in accordance with the present invention. The state of a given memory cell 350a is preferably ascertained from the memory array 370 by a sensing technique which forces a voltage and concurrently measures a signal current $I_S$ 382 (or vice versa), as is known in the art. In this manner, the resistance of the channel can be obtained which relates directly to the logical state of the memory cell. As previously stated, the memory array preferably begins in standby mode and subsequently transitions into a read mode.

With continued reference to FIGS. 11B and 11C, in order to read a selected memory cell 350a in the memory array 370, at least two actions are preferably performed. First, the read word line 312 corresponding to the selected memory cell 350a is preferably driven to a voltage potential above (e.g., higher voltage 382) or below (e.g., lower voltage 384) the equipotential voltage Veq. Second, while in the read mode, a sense amplifier (not shown) is connected to the read bit line 322. The sense amplifier preferably clamps the voltage on the read bit line 322 to the equipotential voltage $V_{eq}$, sourcing an appropriate signal current $I_S$ as is necessary to sustain the voltage drop across the channel of FeGFET 301a, represented as resistor 386a. With respect to the memory cells connected to a selected read bit line 322, a voltage drop from the read bit line 322, across memory cells 350a and 350b, to read word lines 312, 316 only appears across the selected memory cell 350a, and, specifically, the channel of the corresponding FeGFET 301a.

Ideally, the signal current $I_S$ supplied by the sense amplifier to read bit line 322 is substantially equal to a difference between the equipotential voltage Veq and lower voltage 384 on read word line 312, divided by the channel resistance of 301a. Alternatively, if the voltage on read word line 312 is greater than the equipotential voltage Veq, the signal current $I_S$ supplied by the sense amplifier to read bit line 322 is substantially equal to the difference between the equipotential voltage $V_{eq}$ and higher voltage 384, divided by the channel resistance of 301a. The resultant sign indicates whether the sensing current is sourced or sunk from the read bit line 322. It is to be appreciated that the memory cells may read by forcing a predetermined current through the selected memory cell and measuring the resulting voltage across the cell, or, alternatively, by forcing a predetermined voltage across the selected cell and measuring the resulting current through the cell, as will be understood by those skilled in the art.

Preferably, no significant noise current $I_N$ flows through the other FeGFETs (e.g., 301b) connected to the selected read bit line 322, since a driving potential across these FeGFETs 301b is absent. The read word lines (e.g., 316) corresponding to these other memory cells 350b are preferably held at the same potential as the read bit line 322, for example, the equipotential voltage $V_{eq}$. Noise current $I_N$ flowing through one or more unselected memory cells can contaminate sensing during the read operation, since the total current sourced or sunk by the sense amplifier is primarily the sum of the signal current $I_S$ plus any noise current components $I_N$. Noise currents arise primarily from mismatches in the thresholds of the FET transistors. In a worst-case scenario, the total noise current can be greater than the signal current.

Ideally, the sense amplifier forces the equipotential voltage $V_{eq}$ across the selected memory cell (or cells) and zero voltage across unselected memory cells. In this instance, the sensed signal current would then depend only on the state of the selected memory cell 350a. Unfortunately, however, mismatches, such as, for example, in the thresholds of transistors used for clamping the bit lines, word lines, and sense amplifier to $V_{eq}$, may generate small offset voltage drops ($V_{os}$) across unselected memory cells, thereby reducing the signal-to-noise ratio of the memory array 370. An auto-zero sense amplifier (not shown) can be employed to correct for such mismatches, for example, as an offset compensation scheme. Auto-zero techniques (e.g., using auto-zero sense amplifiers) that are suitable for use with the present invention are known by those skilled in the art, and consequently, a detailed discussion of such techniques will not be presented herein.

Referring again to FIG. 11A, a write operation directed to memory cell 350a, referred to herein as the selected memory cell, will be described. It will be assumed that all memory cells, including selected memory cell 350a, are initially in the standby mode of operation. To select a given memory cell 350a for a write operation, the write word line 310 corresponding thereto is driven to a logic high, thereby activating the FET 302a associated with the selected memory cell 350a. As a consequence, the gate terminal of corresponding FeGFET 301a is shunted to write bit line 320. Other write word lines (e.g., 314) associated with unselected memory cells (e.g., 350b, 350d) are preferably held at a logic low state, thereby disabling the FETs associated with the unselected memory cells. In this manner, the gate terminals of the FeGFETs associated with the unselected memory cells are preferably open-circuited from their corresponding write bit lines.

Figure 11D:
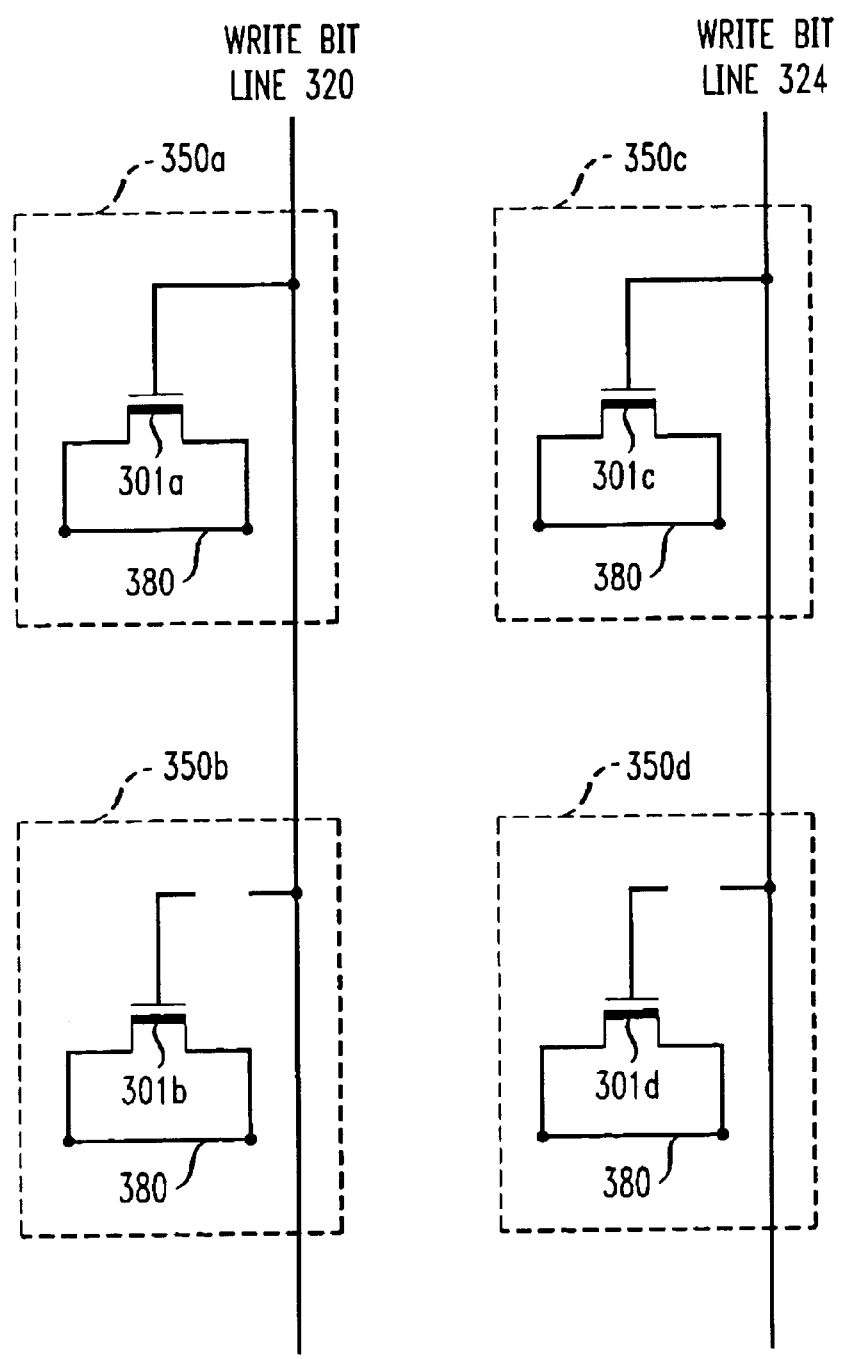
FIG. 11D is a schematic diagram illustrating is functional circuit arrangement of the memory array shown in FIG. 11A, configured for a write operation.

Read word lines 312, 316 and read bit lines 322, 326 are preferably held at the equipotential voltage $V_{eq}$, at least in part to reduce power consumption in the write mode. FIG. 11D illustrates the exemplary memory array 370 configured in the manner thus described. As shown in the figure, read bit lines and word lines have been removed and replaced by equipotential nodes 380 connecting the first and second drain/source terminals of the FeGFETs 301a through 301d together.

With regard to selected memory cell 350a, at least a fraction of the voltage applied to write bit line 320 appears across the ferroelectric gate insulator of FeGFET 301a, or in other words, between the gate terminal of FeGFET 301a and the channel of FeGFET 301a. The potential difference across the channel of FeGFET 301a is equal to a difference between the voltage applied to write bit line 320 and the equipotential voltage $V_{eq}$ appearing at node 380. The field generated by the potential difference preferably writes the ferroelectric dipole of the FeGFET 301a to a positive or negative orientation, corresponding to a logic "1" or "0," respectively, in selected memory cell 350a.

Figure 11E:
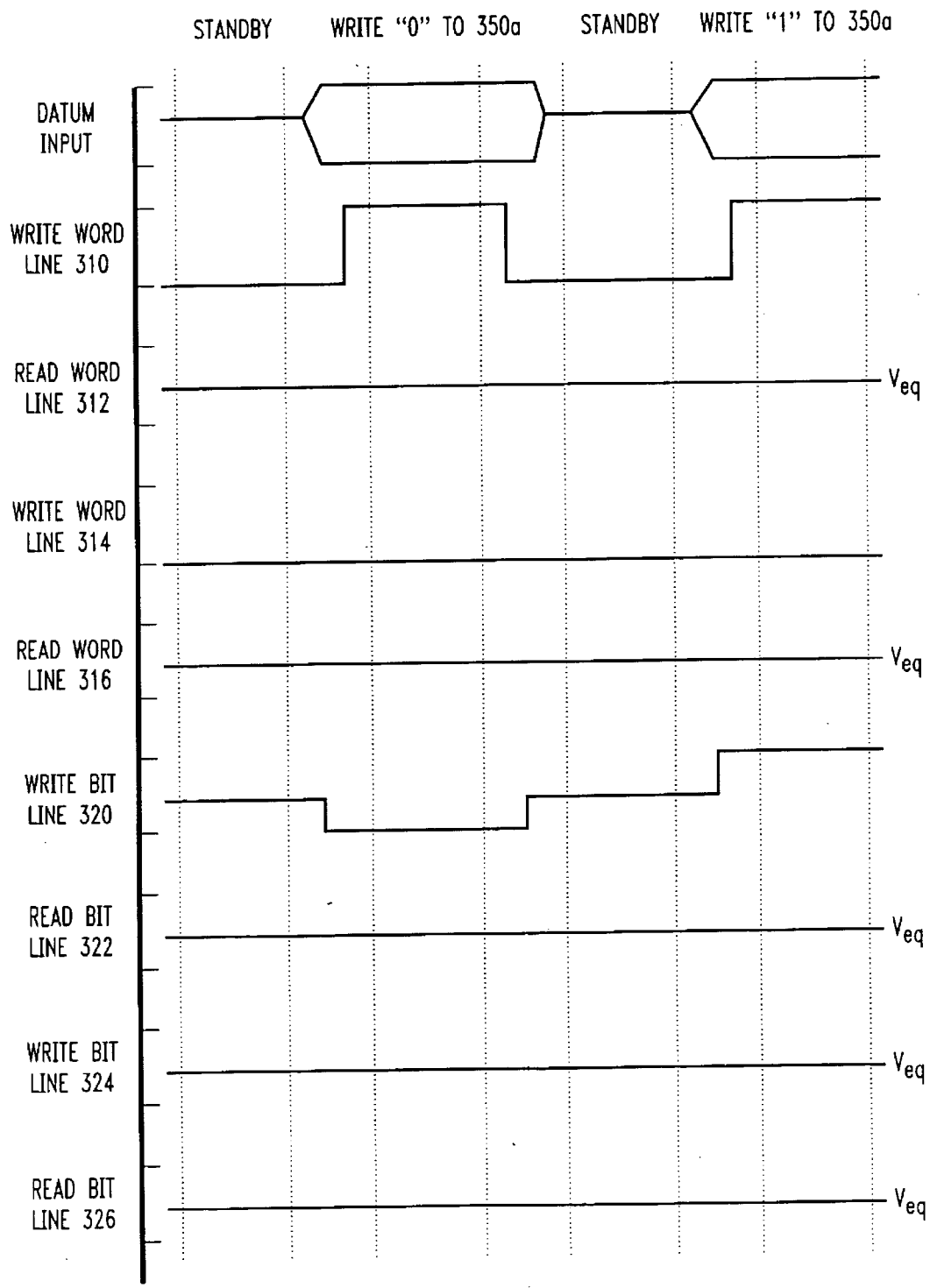
FIG. 11E is a logical timing diagram depicting preferred signals for writing a selected memory cell within the memory array shown in FIG. 11A.

FIG. 11E illustrates an exemplary timing diagram depicting certain signals which may be used to write selected memory cell 350a, in accordance with the present invention. With reference to FIG. 11E, under the heading "write '0' to 350a," a logic low voltage applied to write bit line 320 writes the memory cell 350a to a "0" logic state, whereas under the heading "write '1' to 350a," a logic high voltage applied to write bit line 320 writes the memory cell 350a to a "1" logic state. The state of other unselected memory cells (e.g., 350b, 350d) remains the same since the FeGFETs associated with these memory cells are physically detached from the write bit line 320 as a result of the disabled FETs in these cells. In this example, unselected memory cell 350c is also not written to a new state, even though its FeGFET 301c is coupled to write bit line 324 as a result of active FET 302c. Since the equipotential voltage $V_{eq}$ is applied to write bit line 324, the differential voltage across the ferroelectric dipole of FeGFET 301c of memory cell 350c is zero, and thus the ferroelectric material is at its most bistable point, as previously explained.

Both the read and write operations of the single FET/single FeGFET memory cell implementation shown in FIG. 11A are sacrificed to realize an improvement in memory cell density compared to the dual FET/single FeGFET memory cell configuration of FIG. 9A. Reading the state of the resistive memory cells in a parallel array of cells, as shown in FIGS. 11A and 11B, with an auto-zero sense amplifier, or alternative means, may require more time for evaluation of the logic state of the memory cell as well as requiring a higher precision evaluation, compared to the memory cell configuration of FIG. 9A. Writing according to the preferred method of FIG. 11E also has a significant limitation in that only half the full power supply power is available for writing the ferroelectric dipole since the equipotential voltage 380 remains fixed. By contrast, in writing according to the preferred method of FIG. 9E, the full power supply is available for writing the state of the ferroelectric dipole since the voltage potentials at both sides of the dipole are allowed to swing.

When compared with FIGS. 10A and 11A, FIG. 9A offers a memory array that perhaps provides a more robust write access, more robust standby mode, and higher performance read access. As exemplified by memory cell 150a in FIG. 9A, each memory cell comprises two FETs 102a, 103a and one FeGFET 101a. Unfortunately, memory cell 150a offers the lowest density of the alternative embodiments described herein. The memory array 270 of FIG. 10A is a hybrid of the memory array 170 of FIG. 9A employing a more dense memory cell configuration exemplified by memory cell 250a in FIG. 10A, each memory cell comprises one FET 202a and one FeGFET 201a. A plurality of such memory cells are connected together at a common node 205a to form a group of memory cells 252a. During a read or write directed to a selected memory cell within the group of memory cells 252a, select FET 203a preferably connects common node 205a to read/write bit line 222. Qualitatively, memory array 270 realizes an improvement in density by compromising the robust write operation and standby mode of the memory array of FIG. 9A. While the memory array 370 of FIG. 11A offers the most compact memory cell 350a comprising one FET 302a and one FeGFET 301a, with no select FETs, it does so at the expense of the write operation and read performance. Thus the present invention provides virtually unlimited memory array arrangements in which density, complexity, speed, and other characteristics can be traded as desired.

It is to be appreciated that the three alternative memory architectures discussed above in conjunction with FIGS. 9A through 11E are shown by way of example only, and that other alternative configurations and circuitry are contemplated by the present invention. Tradeoffs between design complexity, density, noise immunity, etc. can be made by choosing an appropriate memory architecture to suit the particular design application, as will be understood by those skilled in the art.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A semiconductor device, comprising:
   a field-effect transistor (FET) formed on a silicon substrate, the FET including a drain region and a source region; and
   a ferroelectric gate field-effect transistor (FeGFET) for storing a logical state of the semiconductor device, the FeGFET comprising:
      a gate electrode formed on an upper surface of the substrate and in electrical contact with one of the drain region and the source region of the FET;
      a ferroelectric gate dielectric layer formed on an upper surface of the gate electrode;
      an electrically conductive channel layer formed on an upper surface of the ferroelectric gate dielectric layer; and
      first and second drain/source electrodes, the first and second drain/source electrodes being formed on and electrically contacting the channel layer at laterally opposing ends of the channel layer;
      wherein the ferroelectric gate dielectric layer is selectively polarizable in response to a potential applied between the gate electrode and at least one of the first and second drain/source electrodes.

2. The semiconductor device of claim 1, wherein the FeGFET is formed between at least two interconnection layers of the semiconductor device.

3. The semiconductor device of claim 1, further comprising an electrically conductive via formed on an upper surface of one of the drain region and the source region of the FET, the via electrically coupling the gate electrode of the FeGFET to one of the drain region and the source region of the FET.

4. A vertical ferroelectric gate field-effect transistor (FeGFET) device, comprising:
   a substrate;
   a first drain/source electrode formed on an upper surface of the substrate;
   an electrically conductive channel region formed on an upper surface of the first drain/source electrode and electrically contacting the first drain/source electrode;
   a ferroelectric gate region formed on at least one side wall of the channel region;
   at least one gate electrode electrically contacting the ferroelectric gate region; and
   a second drain/source electrode formed on an upper surface of the channel region and electrically contacting the channel region;
   wherein the ferroelectric gate region is selectively polarizable in response to a potential applied between the gate electrode and at least one of the first and second drain/source electrodes.

5. The vertical FeGFET device of claim 4, further comprising a field-effect transistor (FET) formed in the substrate below the first drain/source electrode, the FET including a drain terminal and a source terminal, at least one of the drain and source terminals being electrically coupled to the first drain/source electrode.

6. The vertical FeGFET device of claim 4, wherein the channel region is substantially cylindrical, and the ferroelectric gate region is formed as at least a partial ring substantially surrounding an outer sidewall of the channel region.

7. The vertical FeGFET device of claim 4, further comprising:
   a plug formed between the first and second drain/source terminals;
   wherein the channel region is formed as at least a partial ring substantially surrounding the plug.

8. The vertical FeGFET device of claim 7, wherein the plug is formed of a substantially nonconductive material.

9. The vertical FeGFET device of claim 4, wherein the channel region is formed having a U-shaped cross-section substantially surrounding a plug.

10. The vertical FeGFET device of claim 4, wherein the FeGFET is disposed between a first interconnection layer and a second interconnection layer formed on the substrate.

* * * * *